(12) United States Patent
Then et al.

(10) Patent No.: US 11,295,992 B2
(45) Date of Patent: Apr. 5, 2022

(54) TUNNEL POLARIZATION JUNCTION III-N TRANSISTORS

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 16/643,447

(22) PCT Filed: Sep. 29, 2017

(86) PCT No.: PCT/US2017/054373
§ 371 (c)(1),
(2) Date: Feb. 28, 2020

(87) PCT Pub. No.: WO2019/066914
PCT Pub. Date: Apr. 4, 2019

(65) Prior Publication Data
US 2020/0194312 A1 Jun. 18, 2020

(51) Int. Cl.
*H01L 29/778* (2006.01)
*H01L 21/8252* (2006.01)
(Continued)

(52) U.S. Cl.
CPC ...... *H01L 21/8252* (2013.01); *H01L 27/0605* (2013.01); *H01L 29/045* (2013.01);
(Continued)

(58) Field of Classification Search
None
See application file for complete search history.

(56) References Cited

U.S. PATENT DOCUMENTS 4,216,036 A 8/1980 Tsang
6,630,695 B2 10/2003 Chen et al.
(Continued)

FOREIGN PATENT DOCUMENTS

JP 2011049488 3/2011
KR 20140026486 3/2014
(Continued)

OTHER PUBLICATIONS

International Search Report and Written Opinion for International Patent Application No. PCT/US2017/054373, dated Jun. 22, 2018.
(Continued)

*Primary Examiner* — Bilkis Jahan
(74) *Attorney, Agent, or Firm* — Essential Patents Group, LLP

(57) ABSTRACT

Techniques related to III-N transistors having improved performance, systems incorporating such transistors, and methods for forming them are discussed. Such transistors include first and second crystalline III-N material layers separated by an intervening layer other than a III-N material such that the first crystalline III-N material layer has a first crystal orientation that is inverted with respect to a second crystal orientation of the second crystalline III-N material layer.

20 Claims, 10 Drawing Sheets

(51) Int. Cl.
*H01L 27/06* (2006.01)
*H01L 29/04* (2006.01)
*H01L 29/267* (2006.01)
*H01L 29/66* (2006.01)
*H01L 29/73* (2006.01)

(52) U.S. Cl.
CPC ...... *H01L 29/267* (2013.01); *H01L 29/66462* (2013.01); *H01L 29/73* (2013.01); *H01L 29/778* (2013.01)

(56) References Cited

U.S. PATENT DOCUMENTS

| | | |
|---|---|---|
| 8,021,904 B2 | 9/2011 | Chitnis |
| 8,718,110 B2 | 5/2014 | Kyono et al. |
| 2005/0098835 A1 | 5/2005 | Ushiroda et al. |
| 2006/0124960 A1 | 6/2006 | Hirose et al. |
| 2007/0194330 A1 | 8/2007 | Ibbetson et al. |
| 2008/0185608 A1 | 8/2008 | Chitnis |
| 2010/0059781 A1 | 3/2010 | Yokobayashi et al. |
| 2010/0187550 A1 | 7/2010 | Reed et al. |
| 2010/0327322 A1 | 12/2010 | Kub et al. |
| 2011/0012109 A1* | 1/2011 | Kryliouk ........... H01L 21/02433 257/49 |
| 2011/0159669 A1 | 6/2011 | Yang et al. |
| 2011/0233602 A1 | 9/2011 | Hwang |
| 2012/0007097 A1 | 1/2012 | Hebert |
| 2012/0012869 A1 | 1/2012 | Song |
| 2012/0211801 A1* | 8/2012 | Hashimoto ......... H01L 29/7785 257/194 |
| 2012/0322189 A1 | 12/2012 | Nakada et al. |
| 2013/0026489 A1 | 1/2013 | Gambin et al. |
| 2013/0075824 A1 | 3/2013 | Fukushima et al. |
| 2013/0221409 A1* | 8/2013 | Nakajima ........... H01L 29/7787 257/194 |
| 2014/0264380 A1* | 9/2014 | Kub .................... H01L 21/0262 257/77 |
| 2016/0300835 A1 | 10/2016 | Xia et al. |
| 2016/0351564 A1 | 12/2016 | Azize et al. |
| 2017/0018639 A1 | 1/2017 | Teo et al. |
| 2017/0243866 A1 | 8/2017 | Then et al. |
| 2018/0026156 A1 | 1/2018 | Zhang et al. |
| 2018/0076291 A1 | 3/2018 | Koyama et al. |
| 2018/0350944 A1 | 12/2018 | Huang |
| 2020/0357742 A1 | 11/2020 | Then et al. |
| 2020/0411678 A1 | 12/2020 | Radosavljevic et al. |
| 2021/0343703 A1 | 11/2021 | Palacios et al. |

FOREIGN PATENT DOCUMENTS

| | | |
|---|---|---|
| WO | 2013101184 | 7/2013 |
| WO | 2016209263 | 12/2016 |
| WO | 2017153906 | 9/2017 |

OTHER PUBLICATIONS

International Preliminary Report on Patentability from PCT/US2017/054373 dated Apr. 9, 2020, 7 pgs.

Chu, Rongming, et al., "An Experimental Demonstration of GaN CMOS Technology", IEEE Electron Device Letters, vol. 37, No. 3, Mar. 2016, 3 pgs.

Hahn, B., et al., "First Monolithic Integration of GaN-Based Enhancement Mode n-Channel and p-Channel Heterostructure Field Effect Transistors", IRRR TED, vol. 60, No. 10. pp. 3005-3011, 2013.

Nakajima, Akira, et al., "GaN-based complementary metal-oxide-semiconductor inverter with normally off Pch and Nch MOSFETs fabricated using polarisation-induced holes and electron channels", IET Power Electron, 2018, vol. 11, Iss. 4, pp. 689-694.

* cited by examiner

501

502

504

506

508

TUNNEL POLARIZATION JUNCTION III-N TRANSISTORS

CLAIM OF PRIORITY

This Application is a National Stage Entry of, and claims priority to, PCT Application No. PCT/US2017/054373, filed on Sep. 29, 2017 and titled "TUNNEL POLARIZATION JUNCTION III-N TRANSISTORS", which is incorporated by reference in its entirety for all purposes.

TECHNICAL FIELD

Embodiments of the invention generally relate to III-N semiconductor transistors, and more particularly relate to tunnel polarization junction III-N transistors having improved performance.

BACKGROUND

Power management integrated circuits (PMIC) and radio frequency integrated circuits (RFIC) are critical functional blocks in system on a chip (SoC) implementations. Such SoC implementations may be found in mobile computing platforms such as smartphones, tablets, laptops, netbooks, and the like. In such implementations, the PMIC and RFIC are important factors for power efficiency and form factor (and can be as or more important than logic and memory circuits).

In some implementations, III-N material based transistors, such as gallium nitride (GaN) based transistors may be used for high voltage and/or high frequency applications. For example, gallium nitride based devices may be advantageous in some implementations because GaN has a wide band gap (~3.4 eV) as compared to silicon (Si; ~1.1 eV). The wide band gap may allow a GaN transistor to withstand a larger electric field (e.g., applied voltage, $V_{DD}$) before suffering breakdown as compared to Si transistors of similar dimensions. Furthermore, GaN transistors may be scaled to even smaller dimensions while operating at the same Vcc.

While GaN has a high electron mobility (e.g., about 1000 $cm^2/(Vs)$), its hole mobility (with zero strain) is an order of magnitude weaker (e.g., about 100 $cm^2/(Vs)$). Such a hole mobility is still comparable to unstrained Si hole mobility and provides for a feasible GaN p-channel transistor. However, fabricating p-channel GaN transistors and p-channel III-N transistors in general faces many challenges. Current GaN n-channel transistors employ 2D electron gas (2DEG) while GaN p-channel transistors employ a 2D hole gas (2DHG) for their respective transport channels. Some of the challenges in fabricating a p-channel III-N transistors stem from the inability to achieve high p-doping in III-N source and drain materials. The highest active dopant achieved in GaN, for example, is about $5 \times 10^{17}/cm^3$. Such relatively low doping in sources and drains of the p-MOS device results in poor source and drain contact resistance and poor contact between the source and drain and the 2DHG. Furthermore, the fabrication of p-channel III-N transistors face problems in integration with n-channel transistors.

The ability to fabricate high performance p-channel III-N transistors including GaN transistors and would enable all III-N (e.g., all GaN) CMOS implementations of circuits including logic, digital, and analog circuitries spanning low Vcc to high Vcc.

As such, existing techniques do not provide for high performance p-channel III-N transistors. Such problems may become critical in PMIC or RFIC implementations, as well as in other applications that may utilize III-N transistors implementations.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
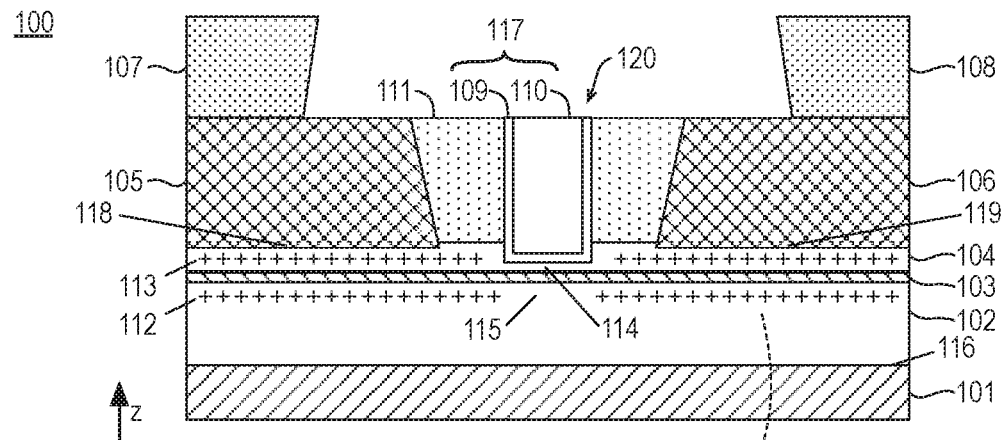
FIG. 1A is a cross-sectional view of an example transistor structure.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C, B and C; or A, B and C.

Transistors, devices, apparatuses, computing platforms, and methods are described below related to tunnel polarization junction III-N transistors.

As described above, it may be advantageous to provide improved III-N transistors including tunnel polarization junction III-N transistors. In an embodiment, a transistor structure includes a first crystalline III-N material layer, a second crystalline III-N material layer, and an intervening layer other than a III-N material therebetween such that the first crystalline III-N material has a first crystal orientation and the second crystalline III-N material has a second crystal orientation inverted with respect to the first crystal orientation. As used herein the term inverted is used to indicate the directionality and/or polarity of the crystals or crystal structures are substantially aligned but in opposite directions. For example, the polarity of the crystals along their c axes may be inverted such that the c axes are substantially aligned but with the crystals having +c polarities that are in opposite directions. Such a layer structure provides a high density 2D electron gas (2DEG) or 2D hole gas (2DHG) (depending on the orientations of the III-N crystalline materials) within the crystalline III-N material layers at the interface of the first crystalline III-N material and the intervening layer and at the interface of the second crystalline III-N material and the intervening layer. By inverting the crystal orientations of the first and second crystalline III-N materials, the polarization properties of the crystalline III-N materials, as discussed further herein, provide the high density 2DEG or 2DHG (depending on the polarization orientations of the first and second crystalline III-N materials) within the first and second crystalline III-N materials. Furthermore, the transistor includes a source, a drain, and a gate between the source and drain that are all electrically coupled to the first crystalline III-N material layer.

In some embodiments, the coupling of the source and the drain to the first crystalline III-N material layer provides a tunnel junction therebetween. The first and second crystalline III-N material layers may include any suitable III-N crystalline materials such as gallium nitride, aluminum nitride, indium nitride, or ternary alloys thereof. In an embodiment, the first and second crystalline III-N material layers comprise gallium nitride such that the first crystalline III-N material has a group III-face (such as a Ga-face) adjacent to the intervening layer and a nitrogen (N)-face opposite (or distal to) the intervening layer and the second crystalline III-N material comprises a group III-face (such as a Ga-face) adjacent to the intervening layer and a nitrogen (N)-face opposite (or distal to) the intervening layer. Such an embodiment provides for a 2DHG within the first crystalline III-N material layer for the implementation of a p-MOS transistor structure. The source and the drain coupled to the first crystalline III-N material layer may then include an N+ doped crystalline material such as N+ doped InGaN to provide the discussed tunnel junctions between the first crystalline III-N material layer and the N+ doped source and drain. Details of such embodiments and additional embodiments are discussed further herein.

Figure 1B:
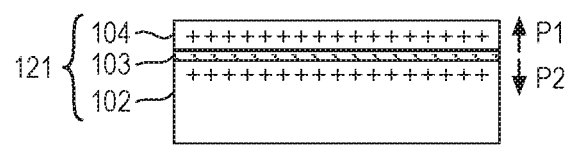
FIG. 1B is a cross-sectional view of a portion of the example transistor structure of FIG. 1A.

FIG. 1A is a cross-sectional view of an example transistor structure 100 and FIG. 1B is a cross-sectional view of a portion of transistor structure 100 including a material stack 121, arranged in accordance with at least some implementations of the present disclosure. As shown in FIG. 1A, transistor structure 100 includes a substrate 101, a III-N crystalline material layer 102, an intervening layer 103, a III-N crystalline material layer 104, a source 105, a drain 106, a gate dielectric 109, a gate electrode 110, a source contact 107, a drain contact 108, and a dielectric layer 111. Also as shown, a 2D hole gas (2DHG) 112 is provided within III-N crystalline material layer 102 (e.g., within III-N crystalline material layer 102 and adjacent to its interface with intervening layer 103) and a 2DHG 113 is provided within III-N crystalline material layer 104 (e.g., within III-N crystalline material layer 104 and adjacent to its interface with intervening layer 103) due to the material selection and crystal orientations of III-N crystalline material layers 102, 104.

As shown in FIG. 1B, material stack 121 of transistor structure 100 includes III-N crystalline material layer 102, intervening layer 103, and III-N crystalline material layer 104 such that 2DHG 113 is provided within III-N crystalline material layer 104 and 2DHG 112 is provided within III-N crystalline material layer 102 as discussed. Material stack 121 may be characterized as a p-type polarization junction, a polarization junction, or the like. III-N crystalline material layer 102 may include any suitable III-N crystalline material such as GaN, AlN, InN, or ternary alloys thereof such as aluminum indium nitride ($Al_xIn_{1-x}N$) or aluminum gallium nitride ($Al_xGa_{1-x}N$), where x is less than 1. Similarly, III-N crystalline material layer 104 may include any III-N crystalline material such as GaN, AlN, InN, $Al_xIn_{1-x}N$, or $Al_xGa_{1-x}N$ such that the crystal orientation of III-N crystalline material layer 104 is inverted with respect to the crystal orientation of III-N crystalline material layer 102. In some embodiments, III-N crystalline material layer 102 and III-N crystalline material layer 104 are the same materials. In other embodiments, III-N crystalline material layer 102 and III-N crystalline material layer 104 are different III-N crystalline materials having the discussed inverted crystal orientations. Although described herein as III-N crystalline material layers 102, 104, layers 102, 104 may include other suitable materials, impurities, etc. For example, layers 102, 104 include III-N crystalline materials such as those described above but layers 102, 104 may also include dopants, other materials, etc. For example, III-N crystalline material layers 102, 104 may be characterized as layers, III-N material layers, III-N material regions, epitaxial III-N material regions, or the like, such that the characterized layers include a crystalline III-N material.

As shown in FIG. 1B with respect to polarity P1 of III-N crystalline material layer 104 and polarity P2 of III-N crystalline material layer 102, the crystal orientations of III-N crystalline material layers 102, 104 are provided such that high density 2DHG 112 and 2DHG 113 are formed or provided within III-N crystalline material layers 102, 104 at the interface of III-N crystalline material layers 102, 104 with intervening layer 103. For example, as is described further below, III-N crystalline material layer 104 has a c-axis that is out of plane with respect to III-N crystalline material layer 104 such that III-N crystalline material layer 104 has a group III-face (such as a Ga-face) adjacent to intervening layer 103 and a nitrogen (N)-face opposite intervening layer 103 (or distal to intervening layer). Furthermore, III-N crystalline material layer 102 has a c-axis that is out of plane with respect to III-N crystalline material layer 102 and has an opposite direction or orientation with respect to the c-axis of III-N crystalline material layer 104 such that III-N crystalline material layer 102 has a nitrogen (N)-face adjacent to intervening layer 103 and a group III-face (such as a Ga-face) opposite intervening layer 103 (or distal to intervening layer). The c-axes of III-N crystalline material layers 102, 104 are substantially aligned but of opposite directions.

Figure 2A:
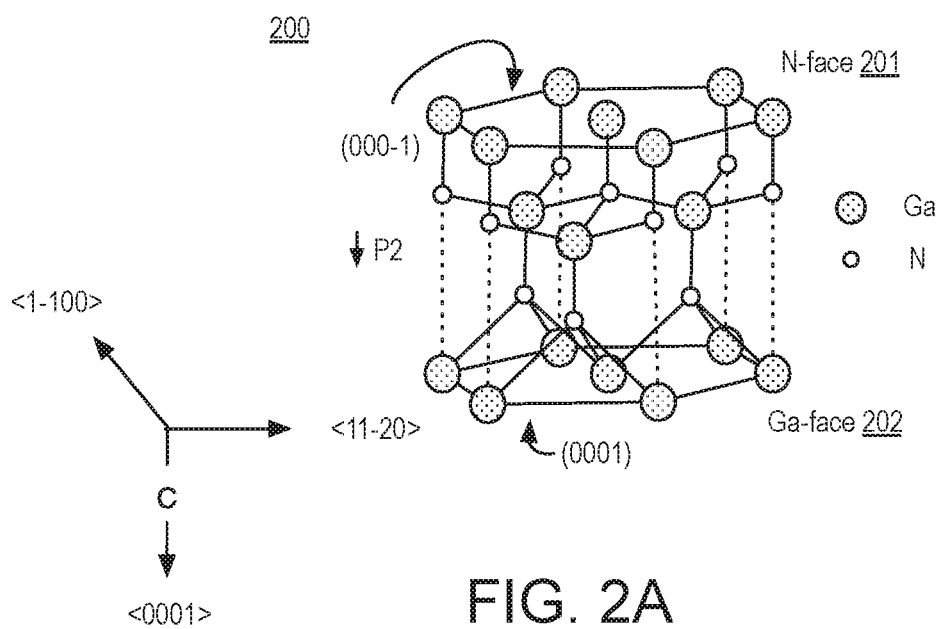
FIG. 2A illustrates an example orientation of a gallium nitride crystal.

FIG. 2A illustrates an example orientation of a gallium nitride crystal 200, arranged in accordance with at least some implementations of the present disclosure. Generally, gallium nitride crystal 200 has a wurtzite crystal structure. GaN and other group III-nitrides described herein may be formed with the illustrated wurtzite structure. As shown in FIG. 2A, gallium nitride crystal 200 has a nitrogen (N)-face 201 and a gallium (Ga)-face 202. Gallium nitride crystal 200 is non-centrosymmetric such that gallium nitride crystal 200 lacks inversion symmetry, and, more particularly, the (0001) and (000-1) planes are not equivalent. As shown, for gallium nitride crystal 200, the (0001) plane is typically referred to as Ga-face 202 (+c polarity or in the <0001> direction) and the (000-1) plane is referred to as N-face 201 (−c polarity, or in the <0001> direction). The orientation in FIG. 2A is therefore referred to or characterized as N-face, N-face GaN, N—GaN, (000-1)-GaN, or the like. That is, for group III-N crystalline structures, one or the other of the (0001) and (000-1) planes (i.e., the Ga-face or the N-face) is often more proximate to a substrate surface (e.g., a surface 116 of substrate 101 from which the device extends) and so the GaN crystal may be referred to as Ga polarity (+c) if the Ga-face (or other group III element-face) is distal from the substrate surface or N polarity (−c) if the Ga-face (or other group III element-face) is proximal to the substrate. With reference to FIGS. 1A and 1B, III-N crystalline material layer 104 is N-face GaN or, more generally an N-face group III-N crystalline material layer such that the N-face of III-N crystalline material layer 104 is furthest from surface 116 of substrate 101 (and the Ga-face of III-N crystalline material layer 104 is proximal to surface 116). Although illustrated with respect to gallium nitride crystal 200, III-N crystalline material layer 104 may include any III-N material(s) discussed herein. For example, III-N crystalline material layer 104 may be N-face AlN or N-face InN such that Al or In replace Ga in gallium nitride crystal 200 or a ternary crystalline structure such that III-N crystalline material layer 104 may be N-face aluminum indium nitride or aluminum gallium nitride.

Figure 2B:
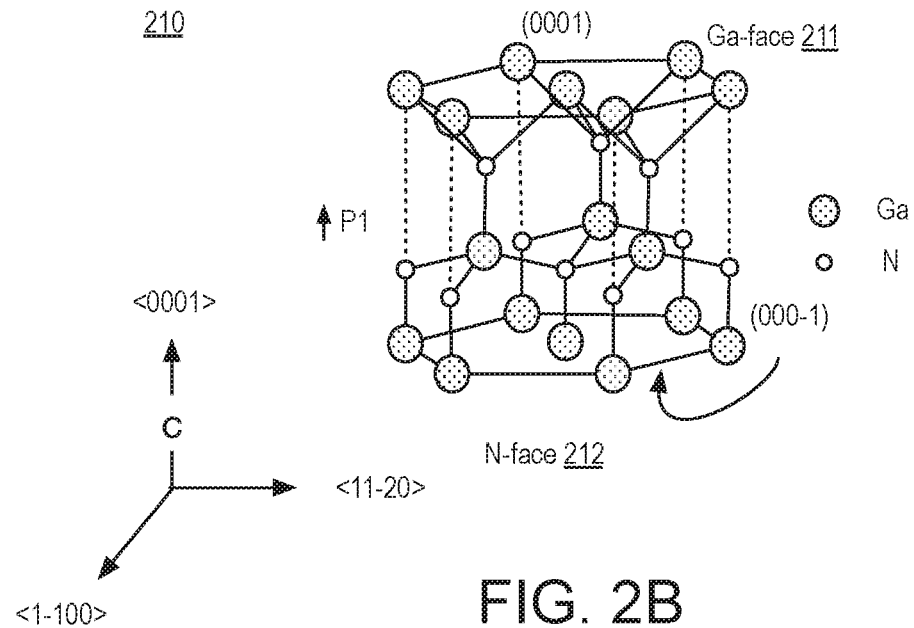
FIG. 2B illustrates another example orientation of a gallium nitride crystal.

FIG. 2B illustrates another example orientation of a gallium nitride crystal 210, arranged in accordance with at least some implementations of the present disclosure. As shown in FIG. 2B, gallium nitride crystal 210 has a gallium (Ga)-face 211 and a nitrogen (N)-face 212. As will be appreciated, gallium nitride crystal 210 is inverted with respect to gallium nitride crystal 200 and, as discussed with respect to gallium nitride crystal 200, gallium nitride crystal 210 is non-centrosymmetric. As shown, for gallium nitride crystal 210, the (0001) plane is referred to as Ga-face 211 (+c polarity, or in the <0001> direction) and the (000-1) plane is referred to as N-face 212 (−c polarity, or in the negative <0001> direction). The orientation in FIG. 2B is therefore referred to or characterized as Ga-face, Ga-face GaN, Ga—GaN, (0001), or the like. As discussed, when the Ga-face (or other group III element-face) is distal to surface 116 of substrate 101 (as is the case in FIGS. 1A, 1B, and 2B), the GaN crystal may be referred to as polarity +c. With reference to FIGS. 1A and 1B, III-N crystalline material layer 102 is Ga-face GaN or, more generally a group III-face III-N crystalline material layer. Although illustrated with respect to gallium nitride crystal 210, III-N crystalline material layer 102 may include any III-N material(s) discussed herein. For example, III-N crystalline material layer 104 may be Al-face AlN or In-face InN such that Al or In replace Ga in gallium nitride crystal 200 or a ternary crystalline structure such that III-N crystalline material layer 102 may be a group III-face aluminum indium nitride or aluminum gallium nitride.

For example, although illustrated with respect to gallium nitride crystals 200, 210 having opposing orientations as described, the III-N crystalline material layers discussed herein such as III-N crystalline material layers 102, 104 may include any suitable group III-N semiconductor material having similar crystal structures to those discussed with respect to gallium nitride crystals 200, 210. For example, the III-N crystalline material layers discussed herein may include any of GaN, AlN, InN, $Al_xIn_{1-x}N$, or $Al_xGa_{1-x}N$. As used herein, the term group III-face is used to indicate the (0001) plane (i.e., in analogy to the Ga-face discussed above) and the corresponding orientation and N-face is used to indicate the (000-1) plane. For example, both the (0001) and the (000-1) planes include seven group III atoms with the (000-1) plane group III atoms each being bonded to a corresponding N atom while the (0001) plane group III atoms share bonds among three N atoms as illustrated in FIGS. 2A and 2B.

Returning to FIGS. 1A and 1B, as discussed, III-N crystalline material layer 104 is an N-face crystal and III-N crystalline material layer 102 is a group III-face crystal. As shown in FIG. 1B, when such an orientation of the crystals of III-N crystalline material layers 102, 104 is provided, the polarization properties of those materials as indicated by polarization P1 and polarization P2 (e.g., having opposite directions or polarities) invoke 2DHG 112 and 2DHG 113 within III-N crystalline material layers 102, 104. Intervening layer 103 may be any suitable material or materials other than a III-N material that provides for, invokes, or elicits 2DHG 112 and 2DHG 113 within III-N crystalline material layers 102, 104 having the crystal orientation discussed above. Intervening layer 103 may be crystalline, polycrystalline, or amorphous and may have any suitable thickness.

For example, intervening layer 103 may be a crystalline material or materials other than a III-N material having any suitable thickness such as a thickness (e.g., in the z direction) of not more than 5 nm. In some embodiment, intervening layer 103 is a crystalline material having a thickness of not more than 3 nm. In an embodiment, intervening layer 103 is a crystalline material including less than 10, less than 7, or less than 5 monolayers. In an embodiment, intervening layer 103 is a crystalline material including oxygen. In an embodiment, intervening layer 103 is or includes a crystalline aluminum oxide ($AlO_x$) material (e.g., sapphire). In an embodiment, intervening layer 103 is or includes a crystalline scandium oxide ($Sc_xO_y$) material. In an embodiment, intervening layer 103 is or includes a crystalline scandium nitride ($Sc_xN_y$) material. In an embodiment, intervening layer 103 is or includes a crystalline aluminum scandium oxide material. In an embodiment, intervening layer 103 includes a first crystalline aluminum nitride layer adjacent to III-N crystalline material layer 102, a second crystalline aluminum nitride layer adjacent to III-N crystalline material layer 104, and a layer of aluminum oxide between the first and second crystalline aluminum nitride layers. That is, intervening layer 103 may include an aluminum oxide layer sandwiched between crystalline aluminum nitride layers. For example, intervening layer 103 may include oxidized surface of the first crystalline aluminum nitride layer adjacent to the second crystalline aluminum nitride layer.

In an embodiment, another layer (not shown) is provided between intervening layer 103 and III-N crystalline material layer 104 such that the additional layer is or includes a crystalline III-N material having a different composition than the either or both of III-N crystalline material layers 102, 104 such that the crystal orientation of the additional layer is inverted with respect to III-N crystalline material layer 102 (and in line with respect to III-N crystalline material layer 104). For example III-N crystalline material layer 104 may be on the additional layer. Such an additional layer may provide for or aid in the discussed crystal orientation inversion between III-N crystalline material layers 102, 104. The additional layer may include any suitable III-N crystalline material such as a crystalline aluminum nitride.

In other embodiments, intervening layer 103 is an amorphous material other than a III-N material having any suitable thickness such as a thickness of not more than 5 nm. For example, intervening layer 103 may be any suitable amorphous material such as amorphous aluminum oxide, amorphous silicon oxide, amorphous silicon nitride, amorphous silicon oxynitride, amorphous hafnium oxide, amorphous zirconium oxide, amorphous hafnium silicon oxide, amorphous titanium silicon oxide, or the like. As is discussed further herein, in embodiments where intervening layer 103 is an amorphous material, III-N crystalline material layer 104 may be formed on another substrate, physically inverted, brought into contact with intervening layer 103, and the substrate may be removed via etch or grind operations to provide III-N crystalline material layer 104 over or on intervening layer 103.

With continued reference to FIG. 1A, as shown, III-N crystalline material layer 102 may be on or over substrate 101. Substrate 101 may include any suitable material or materials. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 101 may include silicon having a (100) crystal orientation with a 4°-11° miscut (with 4°-6° being particularly advantageous). Examples using silicon having a crystal orientation of (110) may offer the advantage of having a smaller mismatch for subsequent epitaxial growth. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

As discussed, III-N crystalline material layer 102 may include any suitable III-N crystalline material such as GaN, AlN, InN, $Al_xIn_{1-x}N$, or $Al_xGa_{1-x}N$. Furthermore, III-N crystalline material layer 102 may include any suitable thickness (e.g., in the z-direction) such as a thickness in the range of about 40-100 nm or the like. Intervening layer 103 may include any suitable materials, thicknesses, characteristics, etc. as discussed above. III-N crystalline material layer 104 may include any suitable III-N crystalline material such as GaN, AlN, InN, $Al_xIn_{1-x}N$, or $Al_xGa_{1-x}N$ such that a crystal orientation of III-N crystalline material layer 104 is inverted with respect to a crystal orientation of III-N crystalline material layer 102. III-N crystalline material layer 102 may include any suitable thickness (e.g., in the z-direction) such as a thickness in the range of about 5-10 nm or the like.

As shown, in an embodiment, III-N crystalline material layer 104 includes a region 114 under a gate structure 117 including gate dielectric 109 and gate electrode 110 that is thinner than a bulk region or portion of III-N crystalline material layer 104. Such a recess, notch, or cut out or the like formed in III-N crystalline material layer 104 may provide for a discontinuity in 2DHG 113 in region 114 of III-N crystalline material layer 104 and/or a discontinuity in 2DHG 112 in region 115 of III-N crystalline material layer 102 such that transistor structure 100 may be in a typically OFF state when no bias is applied to gate electrode 110. Transistor structure 100 may be transitioned to an ON state by applying a negative bias to gate electrode 110 to complete a conductive path between source 105 and drain 106 via 2DHG 113. In another embodiment, no recess, notch, or cut out is provided in III-N crystalline material layer 104 and III-N crystalline material layer 104 may have a similar thickness in region 114 with respect to regions under source 105 and drain 106 such that 2DHG 113 and/or 2DHG 114 extend under gate structure 117. In such embodiments, transistor structure 100 may be in a typically ON state when no bias is applied to gate electrode 110. In such embodiments, transistor structure 100 may be transitioned to an OFF state by applying a positive bias to gate electrode 110 to impede or eliminate the conductive path between source 105 and drain 106.

As shown, transistor structure 100 includes source 105, drain 106, and gate structure 117 between source 105 and drain 106 such that source 105, drain 106, and gate dielectric 109 of gate structure 117 are on III-N crystalline material layer 104 and source 105, drain 106, and gate structure 117 are coupled (i.e., electrically coupled) to III-N crystalline material layer 104. In an embodiment, an intervening layer or layers may be between one or more of source 105, drain 106, and gate structure 117 and III-N crystalline material layer 104, however electrical coupling must be provided. Gate structure 117 may include gate dielectric 109 and gate electrode 110 or gate electrode 110 alone may be characterized as a gate. For example, as used herein the term gate indicates a gate electrode with or without a gate dielectric.

As shown, source 105 and drain 106 are on III-N crystalline material layer 104 and within optional recesses 118, 119 of III-N crystalline material layer 104. Source 105 and 106 may include any suitable material or materials at any suitable dimensions. In an embodiment, source 105 and drain 106 are n-doped materials. In an embodiment, source 105 and drain 106 include an n-doped group III-N semiconductor material such as but not limited to an n-doped GaN or n-doped $In_xGa_{1-x}N$, where x is between 0.01 and 0.1. In an embodiment, source 105 and drain 106 are n-doped $In_{0.1}Ga_{0.9}N$. In an embodiment, the GaN or n-doped $In_xGa_{1-x}N$ of source 105 and drain 106 is doped with an n-type dopant such as Si or Ge having a dopant density that is at least $1e18/cm^3$. In some embodiments, source 105 and drain 106 are the same materials. In other embodiments, source 105 and drain 106 are different materials. Source 105 and drain 106 may have any suitable thicknesses such as thicknesses in the range of about 60-120 nm.

Also as shown, a portion of gate dielectric 109 is on III-N crystalline material layer 104 within a notch, cut out, or recess of III-N crystalline material layer 104 as discussed above. In the illustrated embodiment, gate dielectric 109 lines an opening 120 of dielectric layer 111. In other embodiments, gate dielectric 109 extends along sidewalls of source 105 and 106 and top portions of III-N crystalline material layer 104 between source 105 and gate electrode 110 and between drain 106 and gate electrode 110. Gate dielectric 109 may be characterized as a gate dielectric layer, a dielectric layer or the like and gate dielectric 109 may include any suitable material or material stack of any suitable thickness. In an embodiment, gate dielectric 109 includes a gate dielectric material such as but not limited to aluminum oxide ($Al_2O_3$), hafnium oxide ($HfO_2$), zirconium oxide ($ZrO_2$), titanium silicon oxide (TiSiO), hafnium silicon oxide (HfSiO) or silicon nitride ($Si_3N_4$). In an embodiment, gate dielectric 109 has a thickness in the range of 2-10 nm. In an embodiment, gate dielectric 109 is a composite stack including two separate and distinct layers of gate dielectric materials chosen from the above group of gate dielectric materials. In one such embodiment, a layer of gate dielectric material of one type is disposed on a layer of gate dielectric material of a different type to form the composite stack.

Gate electrode 110 is within opening 120 and gate electrode 110 may be any suitable material or materials. In an embodiment, gate electrode 110 includes a work function layer or material such as but not limited to platinum (Pt), nickel (Ni), titanium nitride (TiN), or tantalum nitride (TaN). In an embodiment, gate electrode 110 includes a gate cap metal on the work function layer or material. In one such embodiment, the gate cap metal is tungsten. In an embodiment, when gate electrode 110 includes a work function layer or material and a gate cap metal, the work function layer or material has a thickness of at least 20 nm. In the illustrated embodiment, the distance between gate electrode 110 and source 105 (i.e., in the x-direction) is the same as or approximately the same as the distance between gate electrode 110 and drain 106 (in the same x-direction). In another embodiment, the distance between gate electrode 110 and source 105 is less than the distance between gate electrode 110 and source 105. Dielectric layer 111 may include any suitable insulating material or material such as a silicon oxide, silicon oxynitride, or silicon carbide.

As discussed, transistor structure 100 may be contacted by vias, metallization layers and the like to form an integrated circuit including many transistor structures 100, n-channel transistor structures, other devices, or the like. As is discussed further herein with respect to FIG. 6, in an embodiment, transistor structure 100 is integrated with an n-channel transistor structure having a polarization layer on a III-N crystalline material layer to invoke an 2D electron gas (2DEG) therein.

With continued reference to FIG. 1A, source contact 107 and drain contact 108 may contact respective portions of source 105 and drain 106 to provide electrical coupling to source 105 and drain 106. Source contact 107 and drain contact 108 may include any suitable material or materials such as nickel, titanium, platinum, or tungsten. As will be appreciated, source contact 107, drain contact 108, and gate electrode 110 may be electrically coupled to vias, metallization layers, and the like to provide routing from transistor structure 100 to higher level circuitry.

Transistor structure 100 provides a p-channel transistor structure including a GaN, AlN, InN, or ternary alloys thereof channel (e.g., within III-N crystalline material layer 104). Transistor structure 100, along with n-channel transistor structures may advantageously provide for all-III-N material CMOS integrated circuits such as logic circuits, digital circuits, and analog circuits that span low Vcc to high Vcc applications. As discussed, transistor structure 100 forms a high mobility 2DHG in the III-N crystalline material using a polarization induced charge mechanism. Furthermore, the use of n-doped source 105 and n-doped drain 106 provides for tunnel junction structures between the n-doped source 105 and III-N crystalline material layer 104 and the n-doped source 106 and III-N crystalline material layer 104, which allows for conduction in electrons until transition to conduction in holes as well as excellent metal contact to source contact 107 and drain contact 108. Such advantages provide improved transistor performance, efficiency, and density.

Discussion now turns to an n-channel transistor structure similar to p-channel transistor structure 100.

Figure 3A:
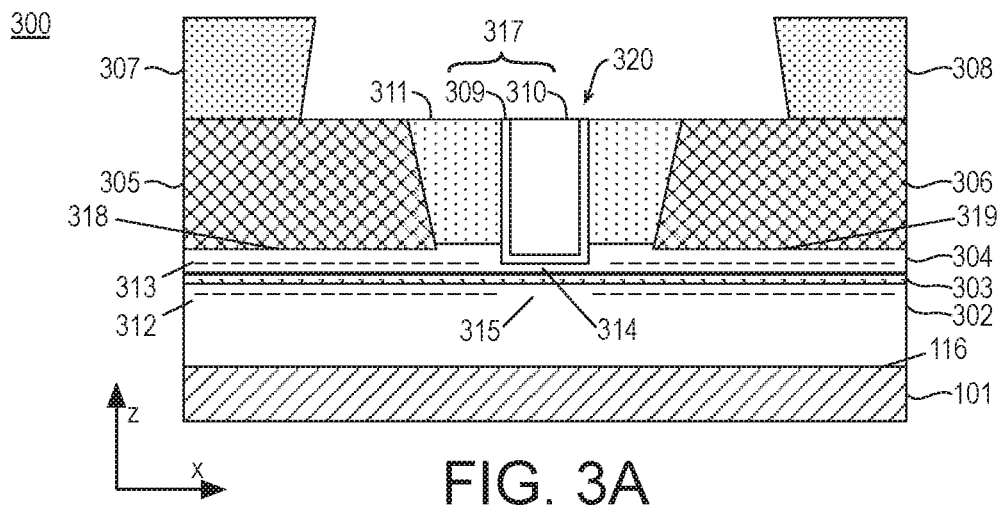
FIG. 3A is a cross-sectional view of an example transistor structure.
Figure 3B:
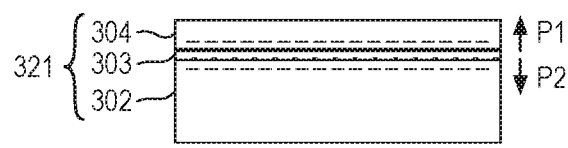
FIG. 3B is a cross-sectional view of a portion of the example transistor structure of FIG. 3A.

FIG. 3A is a cross-sectional view of an example transistor structure 300 and FIG. 3B is a cross-sectional view of a portion of transistor structure 300 including a material stack 321, arranged in accordance with at least some implementations of the present disclosure. As shown in FIG. 3A, transistor structure 300 includes substrate 101, a III-N crystalline material layer 302, an intervening layer 303, a III-N crystalline material layer 304, a source 305, a drain 306, a gate dielectric 309, a gate electrode 310, a source contact 307, a drain contact 308, and a dielectric layer 311. Also as shown, a 2D electron gas (2DEG) 312 is provided within III-N crystalline material layer 302 (e.g., within III-N crystalline material layer 302 and adjacent to its interface with intervening layer 303) and a 2DEG 313 is provided within III-N crystalline material layer 304 (e.g., within III-N crystalline material layer 304 and adjacent to its interface with intervening layer 303) due to the material selection and crystal orientation of III-N crystalline material layers 302, 304.

As shown in FIG. 3B, material stack 321 of transistor structure 300 includes III-N crystalline material layer 302, intervening layer 303, and III-N crystalline material layer 304. Material stack 321 may be characterized as an n-type polarization junction, a polarization junction, or the like. III-N crystalline material layer 302 may include any suitable N-face III-N crystalline material such as GaN, AlN, InN, or ternary alloys thereof such as aluminum indium nitride ($Al_xIn_{1-x}N$) or aluminum gallium nitride ($Al_xGa_{1-x}N$), where x is less than 1. III-N crystalline material layer 304 may include any group III-face III-N crystalline material such as GaN, AlN, InN, $Al_xIn_{1-x}N$, or $Al_xGa_{1-x}N$ such that the crystal orientation of III-N crystalline material layer 304 is inverted with respect to the crystal orientation of III-N crystalline material layer 302. In some embodiments, III-N crystalline material layer 302 and III-N crystalline material layer 304 are the same materials. In other embodiments, III-N crystalline material layer 302 and III-N crystalline material layer 304 are different III-N crystalline materials. Although described herein as III-N crystalline material layers 302, 304, layers 302, 304 may include other suitable materials, impurities, etc. For example, layers 302, 304 include III-N crystalline materials such as those described above but layers 302, 304 may also include dopants, other materials, etc. For example, III-N crystalline material layers 302, 304 may be characterized as layers, III-N material layers, III-N material regions, epitaxial III-N material regions, or the like, such that the characterized layers include a crystalline III-N material.

In the embodiment of transistor structure 300, the crystal orientation of III-N crystalline material layer 302 is that of gallium nitride crystal 200 as discussed herein such that the N-face of III-N crystalline material layer 302 is opposite surface 116 of substrate 101 and adjacent to intervening layer 303 while the Ga-face (or group III-face) of III-N crystalline material layer 302 is adjacent to surface 116 of substrate 101. Furthermore, the crystal orientation of III-N crystalline material layer 304 is that of gallium nitride crystal 210 as discussed herein such that the Ga-face (or group III-face) of III-N crystalline material layer 302 is opposite surface 116 of substrate 101 (and intervening layer 303) and the N-face of III-N crystalline material layer 302 is adjacent to intervening layer 303 and toward surface 116 of substrate 101. Although discussed with respect to gallium nitride crystals 200, 210, III-N crystalline material layers 302, 304 may be any III-N crystalline materials discussed above.

As discussed, III-N crystalline material layer 302 is an N-face crystal and III-N crystalline material layer 304 is a group III-face crystal. As shown in FIG. 3B, when such an orientation of the crystals of III-N crystalline material layers 302, 304 is provided, the polarization properties of those materials as indicated by polarization P1 and polarization P2 (e.g., having opposite directions or polarities) invoke 2DEG 312 and 2DEG 313 within III-N crystalline material layers 102, 104. Intervening layer 303 may be any suitable material or materials other than a III-N material that provides for, invokes, or elicits 2DEG 312 and 2DEG 313 within III-N crystalline material layers 302, 304 having the crystal orientation discussed above. Intervening layer 303 may be crystalline, polycrystalline, or amorphous and may have any suitable thickness.

For example, intervening layer 303 may have any characteristics as discussed with respect to intervening layer 103. In an embodiment, intervening layer 303 is or includes a crystalline material or materials other than a III-N material having a thickness (e.g., in the z direction) of not more than 5 nm or not more than 3 nm. In some embodiments, intervening layer 303 is a crystalline material including less than 10, less than 7, or less than 5 monolayers. In an embodiment, intervening layer 303 is a crystalline material including oxygen. In some embodiments, intervening layer 303 is or includes a crystalline aluminum oxide material, a crystalline scandium oxide material, a crystalline scandium nitride material, or a crystalline aluminum scandium oxide material. In an embodiment, intervening layer 303 includes a first aluminum nitride layer adjacent to III-N crystalline material layer 302, a second aluminum nitride layer adjacent to III-N crystalline material layer 304, and a layer of aluminum oxide between the first and second aluminum nitride layers such that intervening layer 303 includes an aluminum oxide layer sandwiched between aluminum nitride layers. In an embodiment, another layer (not shown) is provided between intervening layer 303 and III-N crystalline material layer 304 such that the additional layer is or includes a crystalline III-N material having a different composition than the either or both of III-N crystalline material layers 102, 104 and such that the crystal orientation of the additional layer is inverted with respect to III-N crystalline material layer 302 (and in line with respect to III-N crystalline material layer 304). For example, III-N crystalline material layer 104 may be on the additional layer. Such an additional layer may provide for or aid in the discussed crystal orientation inversion between III-N crystalline material layers 302, 304. The additional layer may include any suitable III-N crystalline material such as a crystalline aluminum nitride. In other embodiments, intervening layer 303 is an amorphous material other than a III-N material having a thickness of not more than 5 nm. In some embodiments, intervening layer 103 is amorphous aluminum oxide, amorphous silicon oxide, amorphous silicon nitride, amorphous silicon oxynitride, amorphous hafnium oxide, amorphous zirconium oxide, amorphous hafnium silicon oxide, amorphous titanium silicon oxide, or the like.

As shown in FIG. 3A, III-N crystalline material layer 302 is on or over substrate 101, which may have any characteristics discussed herein with respect to FIG. 1A. III-N crystalline material layer 302, intervening layer 303, and III-N crystalline material layer 304 may have any characteristics discussed above. Also as shown, in an embodiment, III-N crystalline material layer 304 includes a region 314 under a gate structure 317 including gate dielectric 309 and gate electrode 310 that is thinner than a bulk region or portion of III-N crystalline material layer 304. Such a recess, notch, or cut out or the like formed in III-N crystalline material layer 304 may, as discussed with respect to III-N crystalline material layer 104 provide for a discontinuity in 2DEG 313 in region 314 of III-N crystalline material layer 304 and/or a discontinuity in 2DEG 312 in region 315 of III-N crystalline material layer 302 such that transistor structure 300 may be in a typically OFF state when no bias is applied to gate electrode 310 and transistor structure 100 may be transitioned to an ON state by applying a positive bias to gate electrode 310 to complete a conductive path between source 305 and drain 306 via 2DEG 312. In another embodiment, no recess, notch, or cut out is provided in III-N crystalline material layer 304 and III-N crystalline material layer 304 may have a similar thickness in region 314 with respect to regions under source 305 and drain 306 such that 2DEG 312 and/or 2DEG 314 extend under gate structure 317 such that transistor structure 300 may be in a typically ON state when no bias is applied to gate electrode 310. In such embodiments, transistor structure 300 may be transitioned to an OFF state by applying a positive bias to gate electrode 310 to impede or eliminate the conductive path between source 305 and drain 306.

As shown, transistor structure 300 includes gate structure 317 between source 305 and drain 306 such that source 305, drain 306, and gate dielectric 309 of gate structure 317 are on III-N crystalline material layer 304 and source 305, drain 306, and gate structure 317 are coupled to III-N crystalline material layer 304. Gate structure 317 may include gate dielectric 309 and gate electrode 310 or gate electrode 110 alone may be characterized as a gate. As shown, source 305 and drain 306 are on III-N crystalline material layer 304 and within optional recesses 318, 319 of III-N crystalline material layer 304. Source 305 and drain 306 may include any suitable material or materials such as n-doped materials. In some embodiments, source 305 and drain 306 include an n-doped group III-N semiconductor material such as but not limited to an n-doped GaN or n-doped $In_xGa_{1-x}N$, where x is between 0.01 and 0.1 such as n-doped $In_{0.1}Ga_{0.9}N$. In an embodiment, the GaN or n-doped $In_xGa_{1-x}N$ of source 305 and drain 306 is doped with Si or Ge having a dopant density that is at least $1e18/cm^3$. Source 305 and drain 306 may be the same materials or they may be different. Furthermore, source 305 and drain 306 may have any suitable thicknesses such as thicknesses in the range of about 60-120 nm.

As shown, in an embodiment, gate dielectric 309 lines an opening 320 of dielectric layer 311. In other embodiments, gate dielectric 309 extends along sidewalls of source 305 and 306 and top portions of III-N crystalline material layer 304 between source 305 and gate electrode 310 and between drain 306 and gate electrode 310. Gate dielectric 309 may be characterized as a gate dielectric layer, a dielectric layer or the like and gate dielectric 309 may include any suitable material or material stack such as a layer or layers of any of aluminum oxide, hafnium oxide, zirconium oxide, titanium silicon oxide, hafnium silicon oxide, silicon nitride, or a stack or such materials of any suitable thickness such as a thickness in the range of 2-10 nm. Gate electrode 310 is within opening 320 and gate electrode 310 may be any suitable material or stack of materials such as a work function layer or material (e.g., having thickness of at least 20 nm) of platinum, nickel, titanium nitride, or tantalum nitride and a gate cap metal such as tungsten on the work function layer or material. In the illustrated embodiment, the distance between gate electrode 310 and source 305 (i.e., in the x-direction) is the same as or approximately the same as the distance between gate electrode 310 and drain. In another embodiment, the distance between gate electrode 310 and source 305 is less than the distance between gate electrode 310 and source 305. Dielectric layer 311 may include any suitable insulating material or material such as a silicon oxide, silicon oxynitride, or silicon carbide.

Source contact 307 and drain contact 308 may contact respective portions of source 305 and drain 306 to provide electrical coupling to source 305 and drain 306. Source contact 307 and drain contact 308 may include any suitable material or materials such as nickel, titanium, platinum, or tungsten. As will be appreciated, source contact 307, drain contact 308, and gate electrode 310 may be electrically coupled to vias, metallization layers, and the like to provide routing from transistor structure 300 to higher level circuitry. Such routing and higher level circuitry may connect n-channel transistor structure 300 to other devices to form an integrated circuit. In an embodiment, the integrated circuit includes p-channel transistor structure 100 and n-channel transistor structure 300. Transistor structure 100 and/or transistor structure 300 may be characterized as inverted III-N crystal transistors, transistors having inverted III-N crystals, transistors having inverted III-N crystal material layers, or the like.

Figure 4:
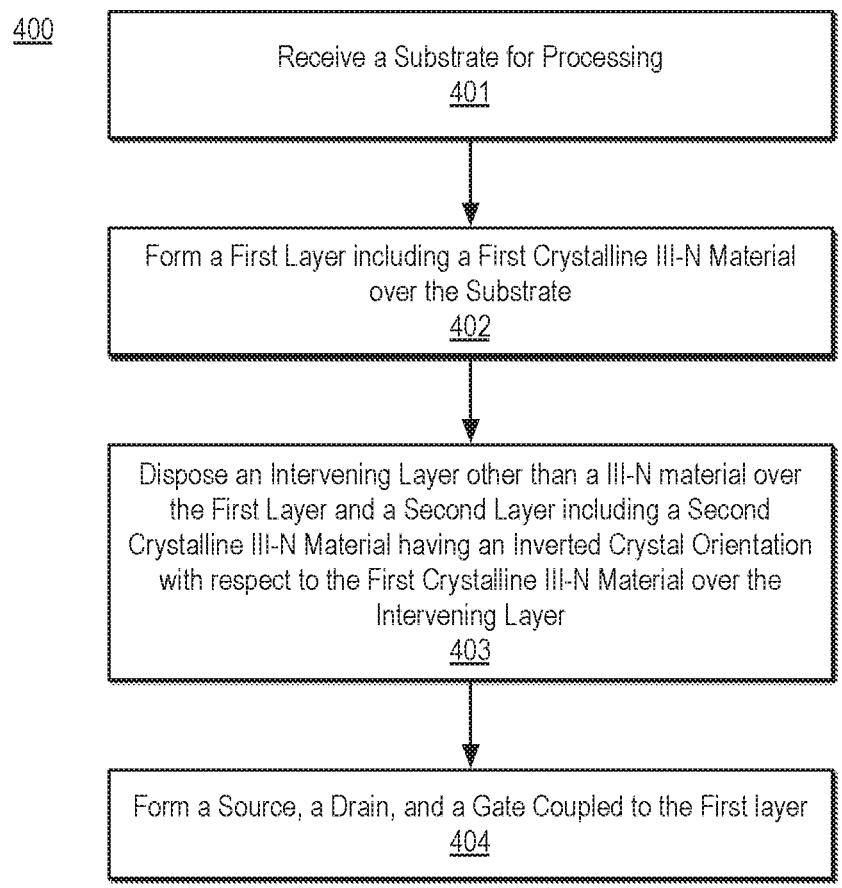
FIG. 4 is a flow diagram illustrating an exemplary process for forming transistors having crystalline III-N material layers with inverted crystal orientations.

FIG. 4 is a flow diagram illustrating an exemplary process 400 for forming transistors having crystalline III-N material layers with inverted crystal orientations, arranged in accordance with at least some implementations of the present disclosure. For example, process 400 may be implemented to fabricate transistor structure 100 or transistor structure 300 as discussed herein. In the illustrated implementation, process 400 may include one or more operations as illustrated by operations 401-404. However, embodiments herein may include additional operations, certain operations being omitted, or operations being performed out of the order provided.

Process 400 begins at operation 401, where a substrate may be received for processing. The substrate may include any suitable substrate as discussed herein such as a silicon wafer or the like. In some embodiments, the substrate includes underlying devices or electrical interconnects. In some embodiments, substrate 101 may be received and processed as discussed with respect to FIGS. 5A-5M.

Process 400 continues at operation 402, where a first layer including a first crystalline III-N material is formed over the substrate. The first layer including the first crystalline III-N material may be characterized as a first crystalline III-N material layer or the like. The first crystalline III-N material layer formed over the substrate may be or include any crystalline III-N material discussed herein having either orientation—group III-face or N-face—depending on whether the transistor structure being formed is a p-channel transistor structure (as illustrated with respect to transistor structure 100) or an n-channel transistor structure (as illustrated with respect to transistor structure 300). For the formation of a p-channel transistor structure, the first crystalline III-N material layer is group III-face (i.e., having a group III-face distal from or opposite the substrate and an N-face adjacent to and/or on the substrate). For the formation of an n-channel transistor structure, the first crystalline III-N material layer is N-face (i.e., having an N-face distal from or opposite the substrate and a group III-face adjacent to and/or on the substrate). The first crystalline III-N material layer may be formed over the substrate using any suitable technique or techniques. In some embodiments, at operation 402, crystalline III-N material layer 503 is formed over substrate 101 as is discussed with respect to FIG. 5B.

Process 400 continues at operation 403, where an intervening layer that is a material other than a III-N material is disposed over or on the first crystalline III-N material layer and a second layer including a second crystalline III-N material is disposed over or on the intervening layer. The intervening layer may be characterized as a layer, an interface layer, or the like and the second layer including the second crystalline III-N material may be characterized as a second crystalline III-N material layer or the like.

As provided in operation 403 of FIG. 4, the second crystalline III-N material layer has an inverted crystal orientation with respect to the first crystalline III-N material layer as discussed herein. In an embodiment, to form a p-channel transistor structure, the second crystalline III-N material layer is N-face (i.e., having an N-face distal from or opposite the substrate and a group III-face adjacent to and/or on the intervening layer). In an embodiment, to form an n-channel transistor structure, the second crystalline III-N material layer is group III-face (i.e., having a group III-face distal from or opposite the substrate and an N-face adjacent to and/or on the intervening layer).

The intervening layer may be disposed over or on the first crystalline III-N material layer and the second crystalline III-N material layer may be disposed over or on the intervening layer using any suitable technique or techniques. In some embodiments, at operation 403, disposing the intervening layer over or on the first crystalline III-N material layer and disposing the second crystalline III-N material layer over or on the intervening layer includes epitaxial growth of each of the intervening layer and the second crystalline III-N material layer as is discussed with respect to FIGS. 5C and 5D. In some embodiments, disposing the intervening layer over or on the first crystalline III-N material layer and disposing the second crystalline III-N material layer over or on the intervening layer includes epitaxial growth of the intervening layer over or on the first crystalline III-N material layer, epitaxial growth of the second crystalline III-N material layer on a sacrificial substrate, bringing the second crystalline III-N material layer into contact with the intervening layer, and removing the sacrificial substrate as is discussed with respect to FIGS. 5C, 5E, 5F, and 5G.

Process 400 continues at operation 404, where a source, a drain, and a gate coupled to the first layer are formed. The source, drain, and gate may include any suitable material or materials. For example, the gate may include a gate dielectric including aluminum oxide, hafnium oxide, zirconium oxide, titanium silicon oxide, hafnium silicon oxide, or silicon nitride and a gate electrode including a work function layer of platinum, nickel, titanium nitride, or tantalum nitride and a tungsten gate cap metal. The source and drain, in either the p-channel embodiment or the n-channel embodiment may include an n-doped group III-N semiconductor material as discussed herein. The source, drain, and gate may be formed using any suitable technique or techniques. In some embodiments, the source, drain, and gate are formed as discussed with respect to FIGS. 5H-5M.

As discussed, process 400 may be implanted to fabricate transistor structure 100 or transistor structure 300. Further details associated with such fabrication techniques are discussed herein and in particular, with respect to FIGS. 5A-5N. Any one or more of the operations of process 400 (or the operations discussed herein with respect to FIGS. 5A-5N) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Figure 5A:
FIGS. 5A, 5B, 5C, 5D, 5E, 5F, 5G, 5H, 5I, 5J, 5K, 5L, 5M, and 5N are side views of example transistor structures as particular fabrication operations are performed.

FIGS. 5A, 5B, 5C, 5D, 5E, 5F, 5G, 5H, 5I, 5J, 5K, 5L, 5M, and 5N are side views of example transistor structures as particular fabrication operations are performed, arranged in accordance with at least some implementations of the present disclosure. As shown in FIG. 5A, transistor structure 501 includes a substrate 101. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V material (e.g., gallium arsenide (GaAs)), a silicon carbide (SiC), a sapphire ($Al_2O_3$), or any combination thereof. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Figure 5B:
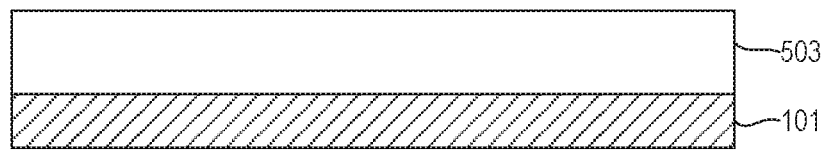

FIG. 5B illustrates a transistor structure 502 similar to transistor structure 501, after the formation or growth of III-N crystalline material layer 503. III-N crystalline material layer 503 may be formed using any suitable epitaxial growth technique such as, for example, an epitaxial growth via chemical vapor deposition (CVD), metal organic chemical vapor deposition (MOCVD), atomic layer deposition (ALD), molecular beam epitaxy (MBE), or any other epitaxial growth technique, with MOCVD and MBE being particularly advantageous. III-N crystalline material layer 503 may include any suitable III-N material such as, for example, GaN, AlN, InN, $Al_xIn_{1-x}N$, or $Al_xGa_{1-x}N$. Furthermore, III-N crystalline material layer 503 includes a crystal orientation (either N-face or group III-face depending on the type of transistor to be fabricated).

In some embodiments, III-N crystalline material layer 503 is a group III-face III-N crystalline material layer (as discussed with respect to FIG. 2B and elsewhere herein) such that III-N crystalline material layer 503 has an N-face adjacent to or on substrate 101 and a group III-face opposite substrate 101. As discussed herein, such embodiments provide for the fabrication of a p-channel transistor structure. In such embodiments where III-N crystalline material layer 503 is GaN, III-N crystalline material layer 503 may be characterized as Ga—GaN or Ga-face GaN.

In other embodiments, III-N crystalline material layer 503 is an N-face III-N crystalline material layer (as discussed with respect to FIG. 2A and elsewhere herein) such that III-N crystalline material layer 503 has a group III-face adjacent to or on substrate 101 and an N-face opposite substrate 101. As discussed herein, such embodiments provide for the fabrication of an n-channel transistor structure. In such embodiments where III-N crystalline material layer 503 is GaN, III-N crystalline material layer 503 may be characterized as N—GaN or N-face GaN.

As discussed, III-N crystalline material layer 503 may be formed using any suitable technique or techniques. For example, III-N crystalline material layer 503 may be grown by an MOCVD process at a temperature in the range of 900-1050° C. III-N crystalline material layer 503 may be formed with the discussed crystal orientation (i.e., group III-face or N face) using selective process conditions for the formation thereof. Such techniques are known in the art and are not discussed further herein.

Figure 5C:
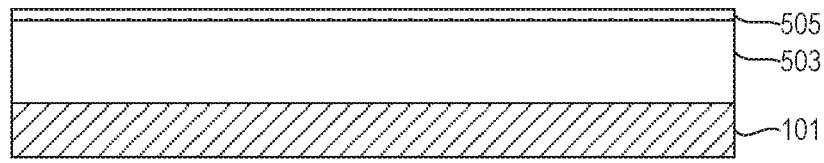

FIG. 5C illustrates a transistor structure 504 similar to transistor structure 503, after the formation (e.g., growth or deposition) of intervening layer 505. Intervening layer 503 may be formed using any suitable growth technique such as, for example, CVD, MOCVD, ALD, MBE, or any other deposition technique. Intervening layer 503 may include any suitable material or materials other than a III-N material and intervening layer 503 may be crystalline or amorphous.

In some embodiments, intervening layer 505 is or includes a crystalline material or materials. In such crystalline intervening layer 505 embodiments, processing may continue as discussed with respect to FIG. 5D such that a second III-N crystalline material layer having an inverted crystal structure with respect to III-N crystalline material layer 503 is formed directly on crystalline intervening layer 505 or on an another layer on crystalline intervening layer 505.

In some embodiments, crystalline intervening layer 505 includes a crystalline material other than a III-N material having a thickness (e.g., in the z direction) of not more than 5 nm or not more than 3 nm or including less than 10, less than 7, or less than 5 monolayers. In an embodiment, intervening layer 505 is a crystalline material including oxygen. In some embodiments, intervening layer 505 is or includes a crystalline aluminum oxide material, a crystalline scandium oxide material, a crystalline scandium nitride material, or a crystalline aluminum scandium oxide material. In an embodiment, intervening layer 505 includes a first aluminum nitride layer adjacent to III-N crystalline material layer 503, a second aluminum nitride layer opposite III-N crystalline material layer 503, and a layer of aluminum oxide between the first and second aluminum nitride layers such that intervening layer 505 includes an aluminum oxide layer sandwiched between aluminum nitride layers. For example, forming intervening layer 503 may include forming a first aluminum nitride layer, oxidizing surface of the first aluminum nitride layer (AlN) opposite III-N crystalline material layer 503 to form an aluminum oxide at the surface, and forming a second aluminum nitride layer on the aluminum oxide (or oxidized) surface. In another embodiment, intervening layer 503 includes the first aluminum nitride layer and the aluminum oxide (or oxidized) surface and the second aluminum nitride layer is not formed.

In other embodiments, intervening layer 505 is an amorphous material other than a III-N material having a thickness of not more than 5 nm. In some embodiments, intervening layer 505 is amorphous aluminum oxide, amorphous silicon oxide, amorphous silicon nitride, amorphous silicon oxynitride, amorphous hafnium oxide, amorphous zirconium oxide, amorphous hafnium silicon oxide, amorphous titanium silicon oxide, or the like. In such amorphous intervening layer 505 embodiments, processing may continue as discussed with respect to FIGS. 5E-5G) such that a second III-N crystalline material layer is formed over a sacrificial substrate. The second III-N crystalline material layer is formed such that it has the same crystal orientation with respect to the sacrificial substrate that III-N crystalline material layer 503 has with respect to substrate 101. The second III-N crystalline material layer is then physically inverted and brought into contact with intervening layer 505 and the sacrificial substrate is removed resulting in the second III-N crystalline material layer being over or on intervening layer 505 and having a crystal orientation that is inverted with respect to the crystal orientation of III-N crystalline material layer 503.

Figure 5D:
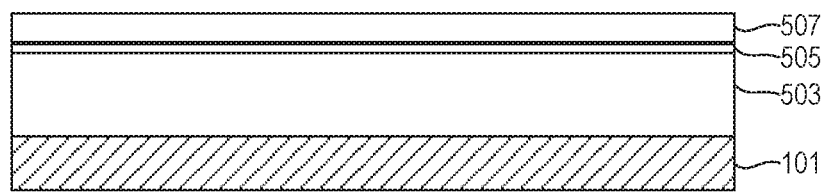

FIG. 5D illustrates a transistor structure 506 similar to transistor structure 504, after the formation (e.g., growth) of III-N crystalline material layer 507 such that III-N crystalline material layer 507 has a crystal orientation that is inverted with respect to the crystal orientation of III-N crystalline material layer 504. III-N crystalline material layer 507 may be formed using any suitable growth technique such as, for example, an epitaxial growth via chemical vapor deposition (CVD), metal organic chemical vapor deposition (MOCVD), atomic layer deposition (ALD), molecular beam epitaxy (MBE), or any other epitaxial growth technique, with MOCVD and MBE being particularly advantageous. III-N crystalline material layer 503 may include any suitable III-N material such as, for example, GaN, AlN, InN, $Al_xIn_{1-x}N$, or $Al_xGa_{1-x}N$. Furthermore, III-N crystalline material layer 507 includes a crystal orientation (either N-face or group III-face as depending on the type of transistor to be fabricated) that is inverted with respect to the crystal orientation of III-N crystalline material layer 503. In some embodiments, the discussed materials of intervening layer 505 cause the crystal orientation of III-N crystalline material layer 507 to be inverted with respect to the crystal orientation of III-N crystalline material layer 503. In an embodiment, prior to the formation of III-N crystalline material layer 507, another III-N crystalline material layer (not shown) is provided such that the III-N crystalline material layer has a different composition than either or both of III-N crystalline material layers 504, 507 and such that the III-N crystalline material layer has a crystal orientation that is inverted with respect to III-N crystalline material layer 503 (and in line with respect to III-N crystalline material layer 507). III-N crystalline material layer 507 is then formed on the additional III-N crystalline material layer having the differing composition. The additional III-N crystalline material layer may include any material or materials that supports the discussed crystal inversion such as aluminum nitride. The additional III-N crystalline material layer may be characterized as a layer separate from III-N crystalline material layer 507 or as a part of III-N crystalline material layer 507.

In embodiments where III-N crystalline material layer 503 is a group III-face III-N crystalline material layer such that III-N crystalline material layer 503 has an N-face adjacent to or on substrate 101 and a group III-face opposite substrate 101 (i.e., a p-channel transistor structure is being fabricated), III-N crystalline material layer 507 is an N-face III-N crystalline material layer such that III-N crystalline material layer 507 has a group III-face adjacent to or on intervening layer 505 and an N-face opposite intervening layer 505. In such embodiments where III-N crystalline material layer 507 is GaN, III-N crystalline material layer 507 may be characterized as N—GaN or N-face GaN.

In embodiments where III-N crystalline material layer 503 is an N-face III-N crystalline material layer such that III-N crystalline material layer 503 has a group III-face adjacent to or on substrate 101 and an N-face opposite substrate 101 (i.e., an n-channel transistor structure is being fabricated), III-N crystalline material layer 507 is a group III-face III-N crystalline material layer such that III-N crystalline material layer 507 has an N-face adjacent to or on intervening layer 505 and a group III-face opposite intervening layer 505. In such embodiments where III-N crystalline material layer 507 is GaN, III-N crystalline material layer 507 may be characterized as Ga—GaN or Ga-face GaN.

As discussed below, transistor structure 506 may be provided for further processing for the formation of source, drain, gate, etc. as is discussed with respect to FIG. 5H. Discussion now turns to the formation of an intervening layer and a III-N crystalline material layer over or on the intervening layer using layer transfer techniques.

Figure 5E:
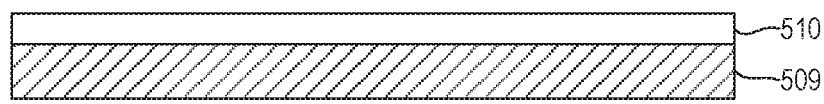

FIG. 5E, illustrates a structure 508 including a sacrificial substrate 509 and a III-N crystalline material layer 510. For example, sacrificial substrate 509 may be a substrate substantially aligned along a predetermined crystal orientation (e.g., (100), (111), (110), or the like). In some examples, sacrificial substrate 509 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. III-N crystalline material layer 510 may be formed using any suitable epitaxial growth technique such as, for example, an epitaxial growth via chemical vapor deposition (CVD), metal organic chemical vapor deposition (MOCVD), atomic layer deposition (ALD), molecular beam epitaxy (MBE), or any other epitaxial growth technique, with MOCVD and MBE being particularly advantageous. III-N crystalline material layer 510 may include any suitable III-N material such as, for example, GaN, AlN, InN, $Al_xIn_{1-x}N$, or $Al_xGa_{1-x}N$. Furthermore, III-N crystalline material layer 510 includes a crystal orientation (either N-face or group III-face as depending on the type of transistor to be fabricated).

As will be discussed further below, structure 508 will be inverted with respect to transistor structure 504 and sacrificial substrate 509 will be removed. Therefore, for III-N crystalline material layer 503 and eventual III-N crystalline material layer 507 to be inverted, III-N crystalline material layer 510 is fabricated with the same crystal orientation with respect to sacrificial substrate 509 that III-N crystalline material layer 503 has with respect to substrate 101. For example, for the eventual formation of p-channel transistor structures, III-N crystalline material layer 510 is a group III-face III-N crystalline material layer such that III-N crystalline material layer 510 has an N-face adjacent to or on sacrificial substrate 509 and a group III-face opposite sacrificial substrate 509. Alternatively, for the eventual formation of n-channel transistor structures, III-N crystalline material layer 510 is an N-face III-N crystalline material layer such that III-N crystalline material layer 510 has a group III-face adjacent to or on sacrificial substrate 509 and an N-face opposite sacrificial substrate 509. As discussed, III-N crystalline material layer 510 may be formed using any suitable technique or techniques. For example, III-N crystalline material layer 510 may be grown by an MOCVD process at a temperature in the range of 900-1050° C. III-N crystalline material layer 510 may be formed with the discussed crystal orientation (i.e., group III-face or N face) using selective process conditions for the formation thereof.

Figure 5F:
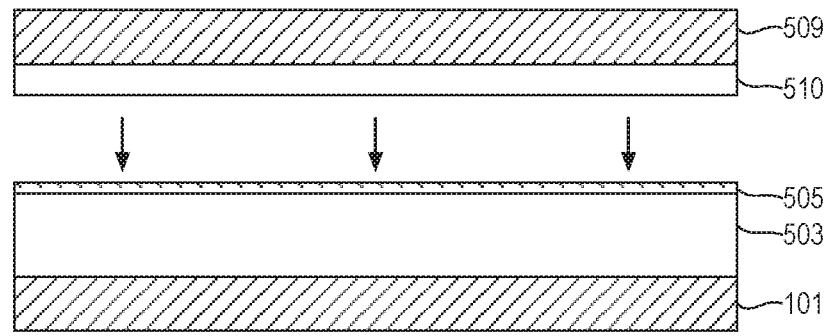

FIG. 5F, illustrates a structure 511 after structure 508 has been inverted with respect to transistor structure 504 (please refer to FIG. 5C) and, as shown, after inversion, III-N crystalline material layer 510 is brought into contact with intervening layer 505. Such techniques may be performed using any suitable technique or techniques. For example, substrate 101 and sacrificial substrate 509 may each be attached to a chuck and III-N crystalline material layer 510 is brought into physical contact with intervening layer 505. Such techniques may be used, for example, when intervening layer 505 is an amorphous material.

Figure 5G:
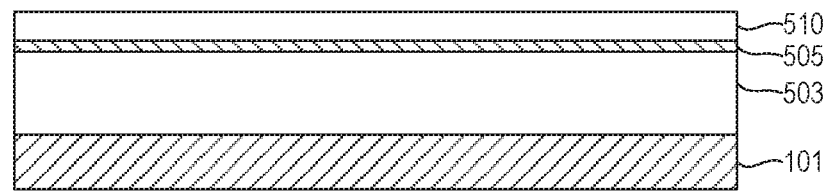

FIG. 5G illustrates a transistor structure 512 similar to transistor structure 511, after III-N crystalline material layer 510 is brought into contact with intervening layer 505 and sacrificial substrate 509 is removed. Sacrificial substrate 509 may be removed using any suitable technique or techniques such as back side grind techniques, etch techniques, or the like. As will be appreciated, III-N crystalline material layer 510 may be secured to intervening layer 505 via Van der Waals forces therebetween. For example, FIGS. 5E-5G illustrate exemplary layer transfer techniques for transferring III-N crystalline material layer 510 onto intervening layer 505.

As discussed, III-N crystalline material layer 510 is physically inverted with respect to III-N crystalline material layer 504 prior to layer transfer such that the crystal orientation off III-N crystalline material layer 510 is inverted with respect to the crystal orientation of III-N crystalline material layer 503. In embodiments where III-N crystalline material layer 503 is a group III-face III-N crystalline material layer such that III-N crystalline material layer 503 has an N-face adjacent to or on substrate 101 and a group III-face opposite substrate 101 (i.e., a p-channel transistor structure is being fabricated), III-N crystalline material layer 510 is an N-face III-N crystalline material layer such that III-N crystalline material layer 510 has a group III-face adjacent to or on intervening layer 505 and an N-face opposite intervening layer 505. In such embodiments where III-N crystalline material layer 510 is GaN, III-N crystalline material layer 510 may be characterized as N—GaN or N-face GaN.

In embodiments where III-N crystalline material layer 503 is an N-face III-N crystalline material layer such that III-N crystalline material layer 503 has a group III-face adjacent to or on substrate 101 and an N-face opposite substrate 101 (i.e., an n-channel transistor structure is being fabricated), III-N crystalline material layer 510 is a group III-face III-N crystalline material layer such that III-N crystalline material layer 510 has an N-face adjacent to or on intervening layer 505 and a group III-face opposite intervening layer 505. In such embodiments where III-N crystalline material layer 510 is GaN, III-N crystalline material layer 510 may be characterized as Ga—GaN or Ga-face GaN.

Furthermore, transistor structure 512 is substantially similar to transistor structure 506 (please refer to FIG. 5D) with the exceptions that, for example, intervening layer 505 of transistor structure 506 may be crystalline while intervening layer 505 of transistor structure 512 may be amorphous and transistor structure 506 includes III-N crystalline material layer 507 while transistor structure 512 includes III-N crystalline material layer 510. In subsequent FIGS. 5H-5M, processing is illustrated with respect to III-N crystalline material layer 507 and transistor structure 506, however, such processing may be performed with III-N crystalline material layer 510 and transistor structure 512.

Figure 5H:
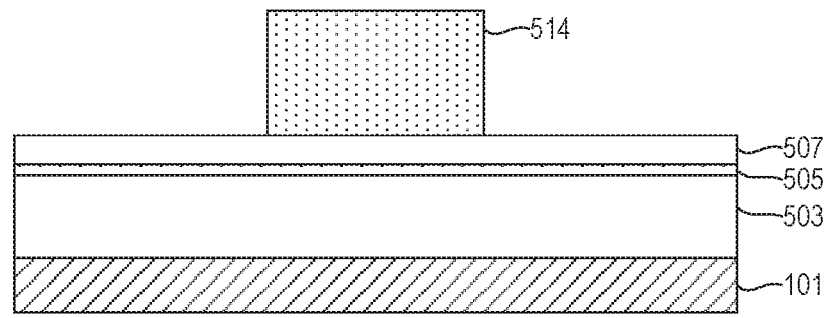

FIG. 5H illustrates a transistor structure 513 similar to transistor structure 506 (please refer to FIG. 5D), after formation of a patterned layer 514. Patterned layer 514 may include any suitable material or materials such as silicon oxide or the like and patterned layer 514 may be formed using any suitable technique or techniques such as by providing a bulk layer or material and patterning the bulk layer or material to provide patterned layer 514.

Figure 5I:
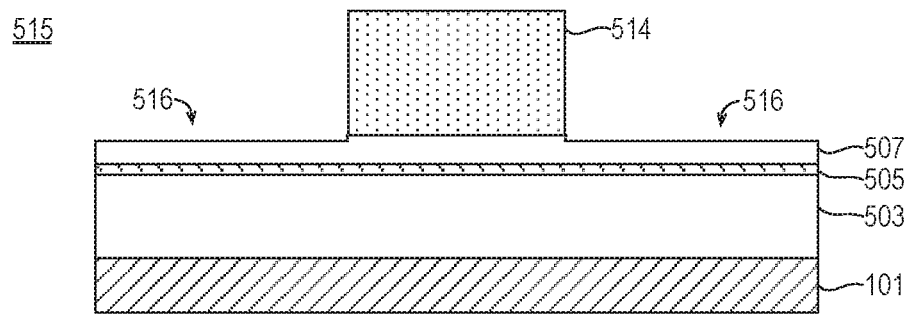

FIG. 5I illustrates a transistor structure 515 similar to transistor structure 513, following the formation of source and drain trenches 516 in III-N crystalline material layer 507 adjacent to edges or sidewalls of patterned layer 514. Source and drain trenches 516 may be characterized as trenches, recesses, or the like and source and drain trenches 516 may be formed using any suitable technique or techniques. In an embodiment, source and drain trenches 516 are formed in III-N crystalline material layer 507 by a plasma etch process. In an embodiment, the plasma etch process utilizes medium to low energy ions and radicals (<0.5 eV ion energy) to form source and drain trenches 516 with substantially sidewalls as shown, In other embodiments, etched sidewalls of source and drain trenches 516 have a tapered profile.

Figure 5J:
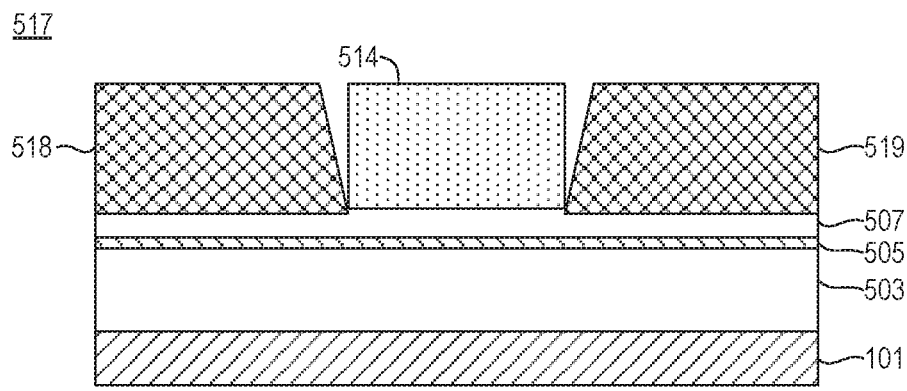

FIG. 5J illustrates a transistor structure 517 similar to transistor structure 515, following the formation of source 518 and drain 519. Source 518 and drain 519 may be formed using any suitable technique or techniques. In an embodiment, source 518 and drain 519 are n-doped source and drain structures. In an embodiment, source 518 and drain 519 are epitaxially grown with in situ doping with silicon and/or germanium. In an embodiment, source 518 and drain 519 are grown using MOCVD techniques such as by performing MOCVD processing at a temperature in the range of 700-800° C. In the illustrated embodiment, source 518 and drain 519 are grown to a height substantially in line with a top surface of patterned layer 514. However, in other embodiments, source 518 and drain 519 have a height that is less than or greater than the top surface of patterned layer 514. Also, in the illustrated embodiment, source 518 and drain 519 are selectively not grown on sidewalls of patterned layer 514. In other embodiments source 518 and drain 519 are grown over (from III-N crystalline material layer 507) at least portions of patterned layer 514. Source 518 and drain 519 may include any materials discussed herein with respect to source 105 and drain 106 and/or source 305 and drain 306 such as an n-doped group III-N semiconductor material such as but not limited to an n-doped GaN or n-doped $In_xGa_{1-x}N$, where x is between 0.01 and 0.1. As will be appreciated, such n-doped source 518 and drain 519 may be incorporated into either or both of p-channel devices and n-channel devices as discussed herein.

Figure 5K:
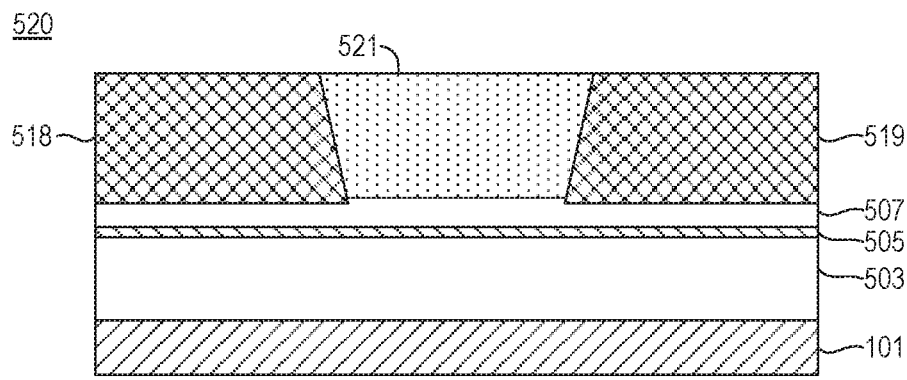

FIG. 5K illustrates a transistor structure 520 similar to transistor structure 517, following the removal of patterned layer 514 and the formation of dielectric layer 521. Dielectric layer 521 may include any suitable insulating material or materials such as one or more of silicon oxide, silicon oxynitride, or silicon carbide and dielectric layer 521 may be formed using any suitable technique or techniques such as plasma enhanced chemical vapor deposition (PECVD), CVD, or physical vapor deposition (PVD) processing followed by planarization operations. In the discussed embodiment, dielectric layer 521 is formed following the removal of patterned layer 514. In another embodiment, dielectric layer 521 may be formed while patterned layer 514 is in place such that no removal of patterned layer 514 is required.

Figure 5L:
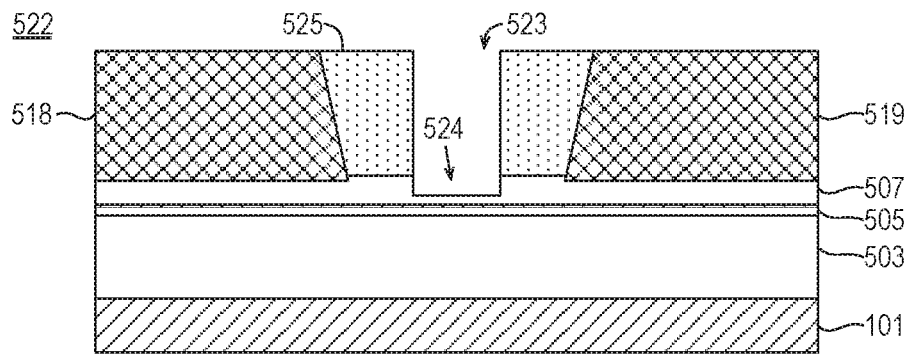

FIG. 5L illustrates a transistor structure 522 similar to transistor structure 520, following the patterning of dielectric layer 521 to form patterned dielectric layer 525 having opening 523 therein and the optional patterning of III-N crystalline material layer 507 to form recess 524 therein. Dielectric layer 521 and III-N crystalline material layer 507 may be patterned using any suitable technique or techniques. In an embodiment, a pattern such as a photoresist pattern having an opening analogous to opening 523 is formed over the top surface of dielectric layer 521, source 518, and drain 519. Subsequently, opening 523 may be formed in dielectric layer 521 via etch techniques to provide patterned dielectric layer 525. Furthermore, recess 524 may be etched into III-N crystalline material layer 507. The photoresist or the like may then be removed. As discussed with respect to FIGS. 1A and 3A, recess 524 (which may also be characterized as a notch or cut out) may provide for a discontinuity in a 2DHG (for a p-channel transistor) or 2DEG (for an n-channel transistor) in III-N crystalline material layer 507 such that the resultant transistor structure may be in a typically OFF state when no bias is applied to a gate electrode of the transistor structure.

Figure 5M:
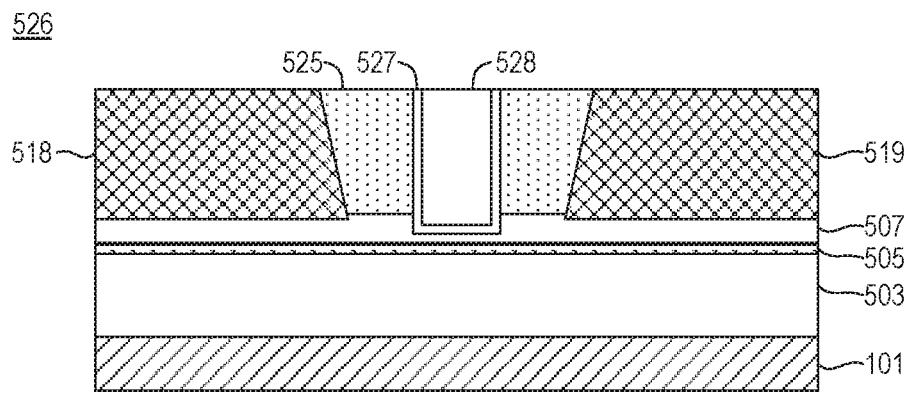

FIG. 5M illustrates a transistor structure 526 similar to transistor structure 522, following the formation of gate dielectric 527 and gate electrode 528. Gate dielectric 527 may include any suitable material or materials such as aluminum oxide, hafnium oxide, zirconium oxide, titanium silicon oxide, hafnium silicon oxide, silicon nitride, or a stack thereof and gate dielectric 527 may be formed using any suitable technique or techniques. In an embodiment, gate dielectric 527 is blanket deposited on the exposed portions III-N crystalline material layer 507, sidewalls of opening 523 within patterned dielectric layer 525, top surfaces of patterned dielectric layer 525, and source 518, and drain 519 and then removed from the top surfaces of patterned dielectric layer 525, and source 518, and drain 519 using planarization and/or etch techniques.

Gate electrode 528 may include any suitable material or materials such as a work function layer or material of platinum, nickel, titanium nitride, or tantalum nitride and a gate cap metal such as tungsten on the work function layer and gate electrode 528 may be formed using any suitable technique or techniques. In an embodiment, a work function layer and/or a gate cap metal layer are deposited by a blanket deposition process onto gate dielectric 527 and top surfaces of patterned dielectric layer 525, and source 518, and drain 519 and then removed from the top surfaces of gate dielectric 527, patterned dielectric layer 525, and source 518, and drain 519 using planarization techniques. In an embodiment, the planarization and/or etch of portions of gate dielectric 527 is performed after the planarization of portions of gate electrode 528.

Figure 5N:
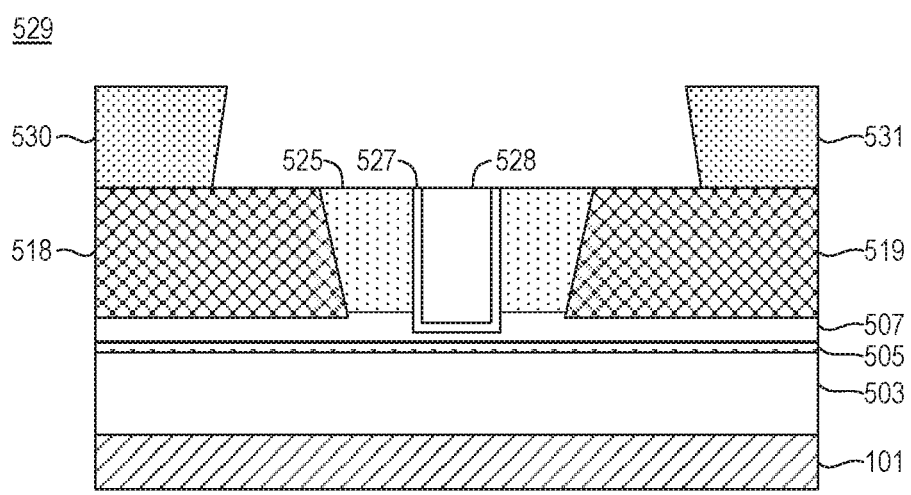

FIG. 5N illustrates a transistor structure 529 similar to transistor structure 526, following the formation of source contact 530 and drain contact 531. Source contact 530 and drain contact 531 may include any material or materials discussed herein such as nickel, titanium, platinum, or tungsten. Furthermore, source contact 530 and drain contact 531 may be formed using any suitable technique or techniques. In an embodiment, a bulk material layer is formed by deposition processing and patterned via patterning and etch processing to form source contact 530 and drain contact 531.

As discussed, operations 401-404 of process 400 and those discussed with respect to FIGS. 5A-5N may be used to fabricate transistor structure 529 such that transistor structure 529 is a p-channel device as illustrated and discussed with respect to transistor structure 100 of FIGS. 1A and 1B or an n-channel device as illustrated and discussed with respect to transistor structure 300 of FIGS. 3A and 3B.

Discussion now turns to integration of a p-channel transistor structure with an n-channel transistor.

Figure 6:
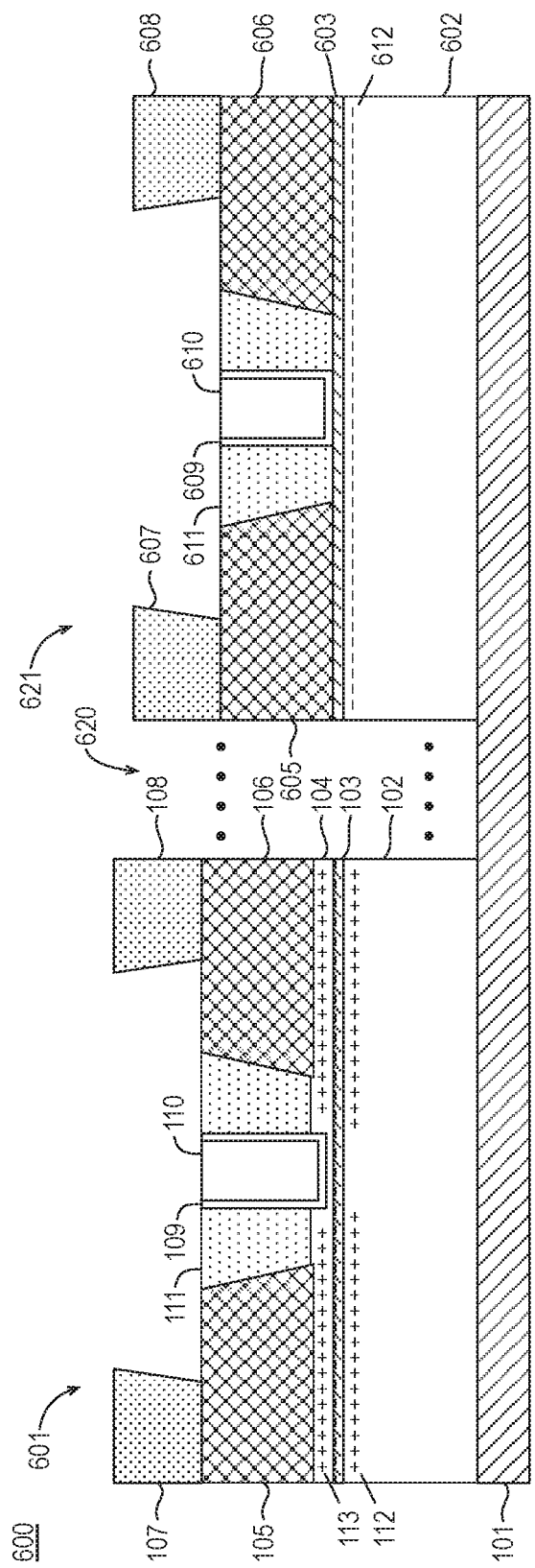
FIG. 6 is a cross-sectional view of an example integrated device including a p-channel transistor structure and an n-channel transistor structure.

FIG. 6 is a cross-sectional view of an example integrated device 600 including a p-channel transistor structure 601 and an n-channel transistor structure 621, arranged in accordance with at least some implementations of the present disclosure. As shown in FIG. 6, integrated device 600 is formed on a shared monolithic substrate 101 such that p-channel transistor structure 601 includes III-N crystalline material layer 102, intervening layer 103, III-N crystalline material layer 104, source 105, drain 106, gate dielectric 109, gate electrode 110, source contact 107, drain contact 108, and dielectric layer 111 and n-channel transistor structure 621 includes a III-N crystalline material layer 602, a polarization layer 603, a source 605, a drain 606, a gate dielectric 609, a gate electrode 610, a source contact 607, a drain contact 608, and a dielectric layer 611. Furthermore, p-channel transistor structure 601 and an n-channel transistor structure 621 are separated by a gap 620, which may be filled or partially filled by a dielectric material for example. Also as shown, 2DHG 112 is provided within III-N crystalline material layer 102 and 2DHG 113 is provided within III-N crystalline material layer 104 due to the material selection and crystal orientation of III-N crystalline material layers 102, 104 as discussed herein. Furthermore a 2DEG 612 is provided within III-N crystalline material layer 602 due to the material selection and crystal orientation of III-N crystalline material layer 602 and the material selection of polarization layer 603.

P-channel transistor structure 601 may have any characteristics as discussed with respect to transistor structure 100. For example, III-N crystalline material layer 102 of p-channel transistor structure 601 is a group III-face III-N crystalline material layer such that III-N crystalline material layer 102 has an N-face adjacent to or on substrate 101 and a group III-face opposite substrate 101 and adjacent to intervening layer 103. Furthermore, III-N crystalline material layer 104 of p-channel transistor structure 601 is an N-face III-N crystalline material layer such that III-N crystalline material layer 104 has a group III-face adjacent to or on intervening layer and an N-face opposite intervening layer.

As shown, n-channel transistor structure 621 includes III-N crystalline material layer 602, which is a group III-face III-N crystalline material layer such that III-N crystalline material layer 602 has an N-face adjacent to or on substrate 101 and a group III-face opposite substrate 101 and adjacent to polarization layer 603. As will be appreciated, III-N crystalline material layer 102 and III-N crystalline material layer 602 therefore have the same crystal orientation. III-N crystalline material layer 602 may include any material or material discussed with respect to III-N crystalline material layer 102. For example, III-N crystalline material layer 602 may include any III-N crystalline material such as GaN, AlN, InN, $Al_xIn_{1-x}N$, or $Al_xGa_{1-x}N$.

Also as shown, n-channel transistor structure 621 includes a polarization layer 603 on III-N crystalline material layer 602. Polarization layer 603 may include any material or materials that invokes 2DEG 612 in III-N crystalline material layer 602 such as AlN, AlInN or $Al_yGa_{1-y}N$, where y is 0.24-0.36. Furthermore, as shown, in an embodiment, n-channel transistor structure 621 includes source 605 and drain 606 on and coupled to portions of polarization layer 603. In an embodiment, portions of polarization layer 603 may be removed and source 605 and drain 606 may be disposed on III-N crystalline material layer 602. Source 605 and drain 606 may include any suitable material or materials such as an n-doped group III-N semiconductor material such as but not limited to an n-doped GaN or n-doped $In_xGa_{1-x}N$, where x is between 0.01 and 0.1. In an embodiment, source 605 and drain 606 are n-doped $In_{0.1}Ga_{0.9}N$. In an embodiment, the GaN or n-doped $In_xGa_{1-x}N$ of source 605 and drain 606 is doped with an n-type dopant such as Si or Ge having a dopant density that is at least $1e18/cm^3$.

With continued reference to FIG. 6, n-channel transistor structure 621 includes a gate structure including a gate dielectric 609 on polarization layer 603 and a gate electrode 610 on gate dielectric such that gate electrode 610 (i.e., the gate) is between source 605 and drain 606 and on polarization layer 603 and such that gate electrode 610 is coupled (i.e., electrically coupled) to III-N crystalline material layer 602. As shown, each of source 605, gate electrode 610, and drain 606 is coupled (i.e., electrically coupled) to III-N crystalline material layer 602. Also as shown, dielectric layer 611 is provided between gate electrode 610 and source 605 and between gate electrode 610 and drain 606. Gate dielectric 609 and gate electrode 610 may include any suitable material or materials. For example, gate dielectric 609 may include one or more of aluminum oxide, hafnium oxide, zirconium oxide, titanium silicon oxide, hafnium silicon oxide, or silicon nitride and gate electrode 610 may include a work function layer or material of platinum, nickel, titanium nitride, or tantalum nitride and a gate cap metal such as tungsten on the work function layer or material.

Furthermore, n-channel transistor structure 621 includes source contact 607 on a portion of source 605 and drain contact 608 on a portion of drain 606. Source contact 607 and drain contact 608 may include any suitable material or materials such as nickel, titanium, platinum, or tungsten. Source contacts 107, 307, drain contacts 108, 308, and gate electrodes 110, 610 may be electrically coupled to vias, metallization layers, and the like to provide routing from transistor structures 601, 621 to higher level circuitry. Such routing and higher level circuitry may connect p-channel transistor structure 601 to n-channel transistor 621 as well as other devices to form an integrated circuit.

The integration of p-channel transistor structure 601 and n-channel transistor 621 into integrated device 600 may advantageously provide an all-III-N material (e.g., all-GaN, etc.) CMOS device that may be employed in a wide variety of applications such as logic, digital, and analog circuitries spanning low Vcc to high Vcc.

In some embodiments, a device or system includes a memory or other device and an integrated circuit including integrated device 600. The integrated circuit may be incorporated into any device such as a PMIC, an RFIC, a logic device, or any device or component discussed with respect to FIGS. 7 and 8 herein. For example a system may include a memory and an integrated circuit coupled to the memory such that the integrated circuit includes p-channel transistor structure 601 (e.g., a PMOS transistor structure) and n-channel transistor 621 (e.g., an NMOS transistor structure). As discussed, p-channel transistor structure 601 includes III-N crystalline material layer 102, III-N crystalline material layer 104, and intervening layer 103 other than a III-N material between III-N crystalline material layers 102, 104 such that the crystalline III-N material of III-N crystalline material layer 102 has a first crystal orientation and the crystalline III-N material of III-N crystalline material layer 104 has a second crystal orientation inverted with respect to the first crystal orientation, and source 105, drain 106, and gate 119 coupled to III-N crystalline material layer 104. Furthermore, n-channel transistor 621 includes III-N crystalline material layer 602, polarization layer 603 on III-N crystalline material layer 602, and source 605, drain 605, gate 610 coupled to (e.g., electrically coupled to) III-N crystalline material layer 602.

In some embodiments, the integration of p-channel transistor structure 601 and n-channel transistor 621 into integrated device 600 may include forming certain analogous components thereof simultaneously. For example, III-N crystalline material layer 102 and III-N crystalline material layer 602 may be formed simultaneously under the same operating conditions as they may include the same material having the same crystal orientation as discussed above. For example, III-N crystalline material layer 102 and III-N crystalline material layer 602 may be formed as discussed with respect to crystalline III-N material layer 503. After such processing, one of p-channel transistor structure 601 or n-channel transistor 621 may be masked using a patterned mask of, for example, silicon oxide, while the other is exposed.

For example, if p-channel transistor structure 601 is masked first, polarization layer 603 is formed on the exposed portion of III-N crystalline material layer 602 of n-channel transistor 621. Polarization layer 603 may be formed using any suitable technique or techniques such as MOCVD techniques or the like. The p-channel transistor structure 601 may then be exposed while n-channel transistor 621 is masked. During the masking of n-channel transistor 621, intervening layer 103 and III-N crystalline material layer 104 are formed using any suitable technique or techniques discussed with respect to intervening layer 505 and III-N crystalline material layer 507 such that III-N crystalline material layer 104 has an inverted crystal structure with respect to the crystal structure of III-N crystalline material layer 102. Alternatively, n-channel transistor structure 621 may be masked first such that intervening layer 103 and III-N crystalline material layer 104 are formed on the exposed portion of III-N crystalline material layer 102 of p-channel transistor structure 601. Subsequently p-channel transistor structure 601 may be masked and polarization layer 603 is formed on the exposed portion of III-N crystalline material layer 602 of n-channel transistor 621.

Subsequent processing may also be performed such that other analogous components are formed at least partially simultaneously. For example, sources 105, 605 and drains 106, 606 may be formed simultaneously as discussed with respect to source 518 and drain 519, gate dielectrics 109, 609 and gate electrodes 110, 610 may be formed simultaneously as discussed with respect to gate dielectric 527 and gate electrode 528, and/or source contacts 107, 607 and drain contacts 108, 608 may be formed simultaneously as discussed with respect to source contact 530 and drain contact 531 herein.

Such integration and simultaneous processing may provide advantageous integrated devices as discussed above as well as complexity and cost savings in fabrication.

Figure 7:
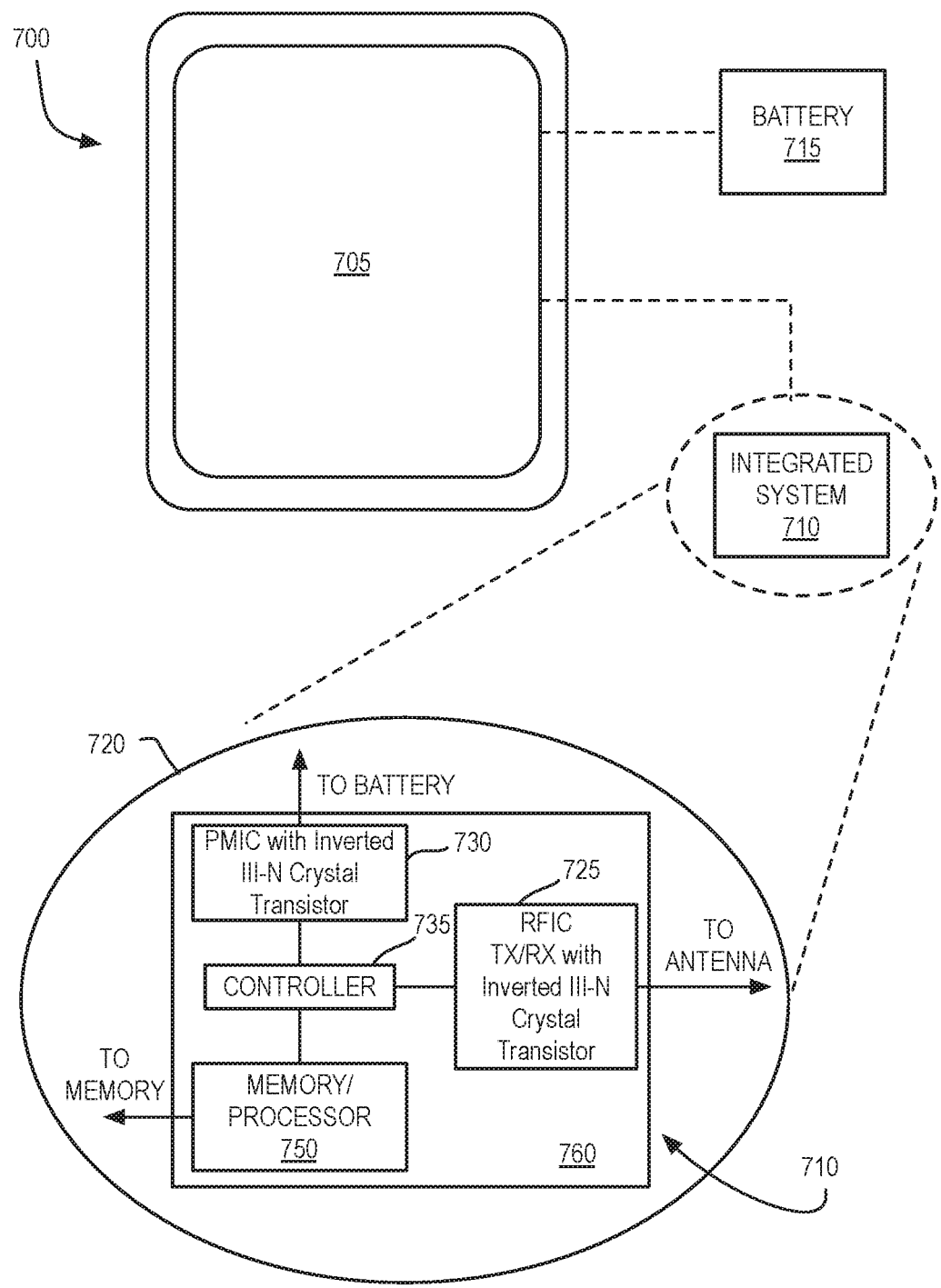
FIG. 7 is an illustrative diagram of a mobile computing platform employing an IC with transistor(s) or transistor structure(s) having crystalline III-N material layers with inverted crystal orientations.

FIG. 7 is an illustrative diagram of a mobile computing platform 700 employing an IC with transistor(s) or transistor structure(s) having III-N crystalline material layers with inverted crystal orientations, arranged in accordance with at least some implementations of the present disclosure. A transistor having III-N crystalline III-N material layers with inverted crystal orientations may be any transistors as discussed herein such as transistor structure 100 or transistor structure 300. Mobile computing platform 700 may be any portable device configured for each of electronic data display, electronic data processing, wireless electronic data transmission, or the like. For example, mobile computing platform 700 may be any of a tablet, a smart phone, a netbook, a laptop computer, etc. and may include a display screen 705, which in the exemplary embodiment is a touch-screen (e.g., capacitive, inductive, resistive, etc. touch-screen), a chip-level (SoC) or package-level integrated system 710, and a battery 715.

Integrated system 710 is further illustrated in the expanded view 720. In the exemplary embodiment, packaged device 750 (labeled "Memory/Processor" in FIG. 7) includes at least one memory chip (e.g., RAM), and/or at least one processor chip (e.g., a microprocessor, a multi-core microprocessor, or graphics processor, or the like). In an embodiment, the package device 750 is a microprocessor including an SRAM cache memory. Packaged device 750 may be further coupled to (e.g., communicatively coupled to) a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller thereof 735. In general, packaged device 750 may be also be coupled to (e.g., communicatively coupled to) display screen 705. As shown, one or both of PMIC 730 and RFIC 725 may employ transistor(s) or transistor structure(s) having III-N crystalline III-N material layers with inverted crystal orientations. For example, an employed transistor may include a first layer comprising a first crystalline III-N material, a second layer comprising a second crystalline III-N material, an intervening layer other than a III-N material between the first layer and the second layer, such that the first crystalline III-N material has a first crystal orientation and the second crystalline III-N material has a second crystal orientation inverted with respect to the first crystal orientation, and a source, a drain, and a gate coupled to the first layer, and any other feature(s) as discussed herein. In an embodiment, an IC includes the employed transistor such that the employed transistor is a PMOS transistor and a second transistor such the second transistor is an NMOS transistor on a shared substrate with the PMOS transistor such that the NMOS transistor includes a third layer on the substrate, the third layer comprising a third crystalline III-N material, a polarization layer on the third layer, and a second source, a second drain, and a second gate coupled to the third layer.

Functionally, PMIC 730 may perform battery power regulation, DC-to-DC conversion, etc., and so has an input coupled to battery 715 and with an output providing a current supply to other functional modules. In an embodiment, PMIC 730 may perform high voltage operations. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 750 or within a single IC (SoC) coupled to the package substrate of the packaged device 750.

Figure 8:
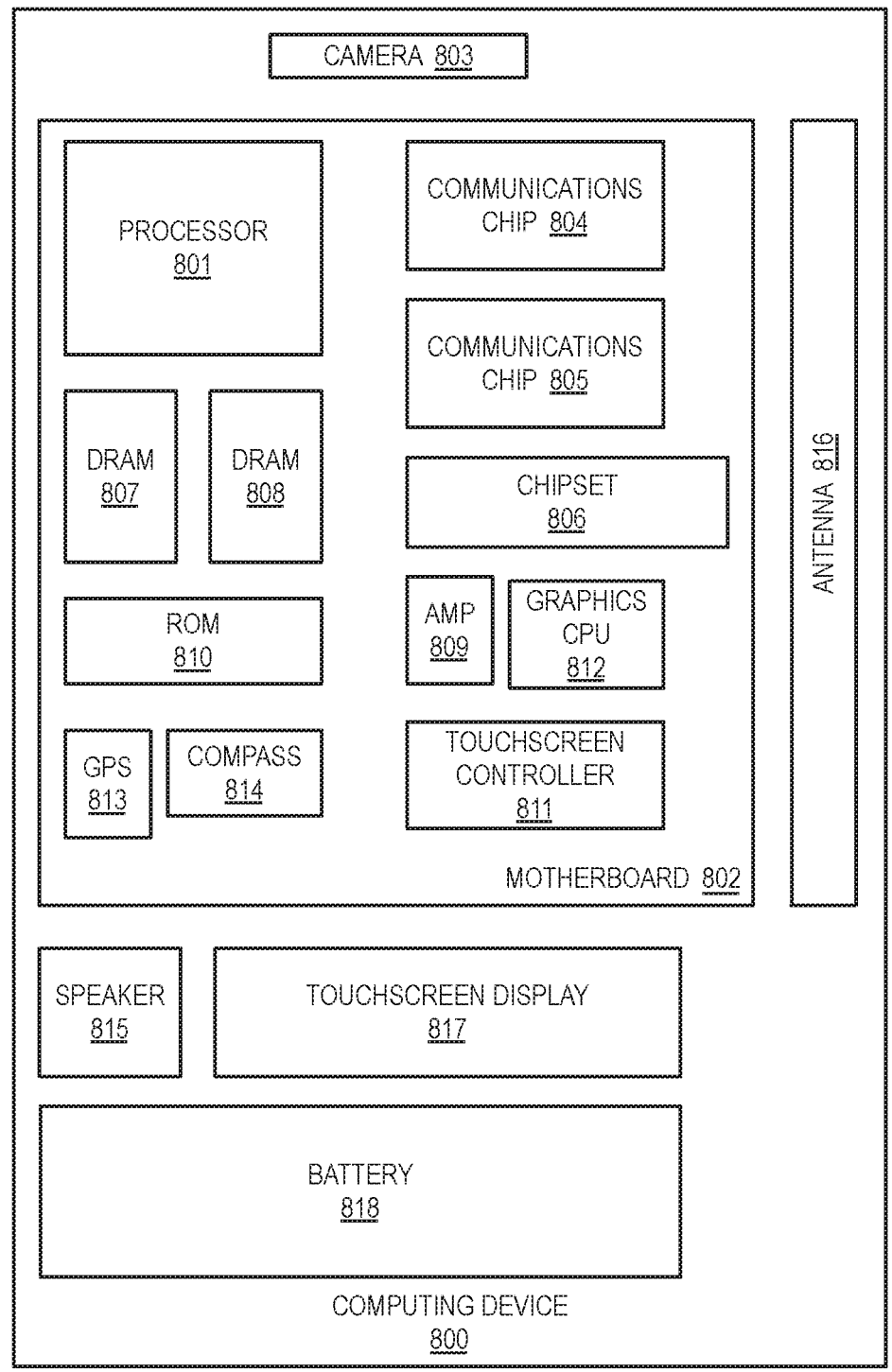
FIG. 8 is a functional block diagram of a computing device, all arranged in accordance with at least some implementations of the present disclosure.

FIG. 8 is a functional block diagram of a computing device 800, arranged in accordance with at least some implementations of the present disclosure. Computing device 800 may be found inside platform 700, for example, and further includes a motherboard 802 hosting a number of components, such as but not limited to a processor 801 (e.g., an applications processor) and one or more communications chips 804, 805. Processor 801 may be physically and/or electrically coupled to motherboard 802. In some examples, processor 801 includes an integrated circuit die packaged within the processor 801. In general, the term "processor" may refer to any device or portion of a device that processes electronic data from registers and/or memory to transform that electronic data into other electronic data that may be stored in registers and/or memory. A device or component of computing device 800 may include transistor(s) or transistor structure(s) having III-N crystalline III-N material layers with inverted crystal orientations as discussed herein.

In various examples, one or more communication chips 804, 805 may also be physically and/or electrically coupled to the motherboard 802. In further implementations, communication chips 804 may be part of processor 801. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics processor 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 804, 805 may enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 804, 805 may implement any of a number of wireless standards or protocols, including but not limited to those described elsewhere herein. As discussed, computing device 800 may include a plurality of communication chips 804, 805. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a transistor structure comprises a first layer comprising a first crystalline III-N material, a second layer comprising a second crystalline III-N material, an intervening layer other than a III-N material between the first layer and the second layer, such that the first crystalline III-N material has a first crystal orientation and the second crystalline III-N material has a second crystal orientation inverted with respect to the first crystal orientation, and a source, a drain, and a gate coupled to the first layer.

In one or more second embodiments, for any of the first embodiments, the first and second crystalline III-N materials comprise gallium nitride.

In one or more third embodiments, for any of the first or second embodiments, the first crystal orientation comprises a first c-axis out of plane with respect to the first layer, the second crystal orientation comprises a second c-axis out of plane with respect to the second layer, and the first c-axis and the second c-axis are substantially aligned.

In one or more fourth embodiments, for any of the first through third embodiments, the first crystalline III-N material comprises a group III-face adjacent to the intervening layer and a nitrogen (N)-face opposite the intervening layer and the second crystalline III-N material comprises a group III-face adjacent to the intervening layer and a nitrogen (N)-face opposite the intervening layer.

In one or more fifth embodiments, for any of the first through fourth embodiments, the first crystalline III-N material comprises a nitrogen (N)-face adjacent to the intervening layer and a group III-face opposite the intervening layer and the second crystalline III-N material comprises a nitrogen (N)-face adjacent to the intervening layer and a group III-face opposite the intervening layer.

In one or more sixth embodiments, for any of the first through fifth embodiments, the intervening layer comprises a third crystalline material having a thickness of not more than 5 nm.

In one or more seventh embodiments, for any of the first through sixth embodiments, the third crystalline material comprises oxygen and one or both of aluminum and scandium.

In one or more eighth embodiments, for any of the first through seventh embodiments, the transistor structure further comprises a third layer on the intervening layer, such that the third layer comprises a third crystalline III-N material having a different composition than the first crystalline III-N material and the third crystalline III-N material has a third crystal orientation that is inverted with respect to the second crystal orientation, such that the first layer is on the third layer.

In one or more ninth embodiments, for any of the first through eighth embodiments, the intervening layer comprises an amorphous material having a thickness of not more than 5 nm.

In one or more tenth embodiments, for any of the first through ninth embodiments, the amorphous material comprises at least one of aluminum oxide, silicon oxide, silicon nitride, or silicon oxynitride.

In one or more eleventh embodiments, for any of the first through tenth embodiments, the first crystalline III-N material comprises gallium nitride having a gallium-face adjacent to the intervening layer and a nitrogen-face opposite the intervening layer, the second crystalline III-N material comprises gallium nitride having a gallium-face adjacent to the intervening layer and a nitrogen-face opposite the intervening layer, the intervening layer comprises a third crystalline material comprising oxygen and aluminum, and the source and the drain comprise n-doped indium gallium nitride.

In one or more twelfth embodiments, a system includes a memory and an integrated circuit coupled to the memory, the integrated circuit including a transistor structure according to any of the first through eleventh embodiments.

In one or more thirteenth embodiments, for any of the twelfth embodiments, the system further includes an antenna coupled to the processor and a battery coupled to the processor.

In one or more fourteenth embodiments, a system includes a means for storing data including and a means for processing the stored data coupled to the means for storing data, the means for processing including a transistor structure according to any of the first through eleventh embodiments.

In one or more fifteenth embodiments, for any of the fourteenth embodiments, the system further includes a means for transmitting wireless data coupled to the means for processing the stored data.

In one or more sixteenth embodiments, a system comprises a memory and an integrated circuit coupled to the memory, the integrated circuit including a transistor structure comprising a first layer comprising a first crystalline III-N material, a second layer comprising a second crystalline III-N material, an intervening layer other than a III-N material between the first layer and the second layer, such that the first crystalline III-N material has a first crystal orientation and the second crystalline III-N material has a second crystal orientation inverted with respect to the first crystal orientation, and a source, a drain, and a gate coupled to the first layer.

In one or more seventeenth embodiments, for any of the sixteenth embodiments, the transistor structure comprises a PMOS transistor structure and the integrated circuit further comprises a substrate, such that the first layer is on the substrate, and an NMOS transistor structure comprising a third layer on the substrate, the third layer comprising a third crystalline III-N material, a polarization layer on the third layer, and a second source, a second drain, and a second gate coupled to the third layer.

In one or more eighteenth embodiments, for any of the sixteenth or seventeenth embodiments, the first crystalline III-N material comprises a group III-face adjacent to the intervening layer and a nitrogen (N)-face opposite the intervening layer and the second crystalline III-N material comprises a group III-face adjacent to the intervening layer and a nitrogen (N)-face opposite the intervening layer.

In one or more nineteenth embodiments, for any of the sixteenth through eighteenth embodiments, the third crystalline III-N material comprises a group III-face adjacent to the polarization layer and a nitrogen (N)-face opposite the polarization layer.

In one or more twentieth embodiments, for any of the sixteenth through nineteenth embodiments, the first, second, and third crystalline III-N materials comprise gallium nitride and the source, the drain, the second source, and the second drain comprise n-doped indium gallium nitride.

In one or more twenty-first embodiments, for any of the sixteenth through twentieth embodiments, the intervening layer comprises a fourth crystalline material having a thickness of not more than 5 nm and the fourth crystalline material comprises oxygen and aluminum.

In one or more twenty-second embodiments, for any of the sixteenth through twenty-first embodiments, the integrated circuit comprises one of a power management integrated circuit (PMIC) or a radio frequency integrated circuit (RFIC).

In one or more twenty-third embodiments, a method for fabricating a transistor structure comprises forming a first layer comprising a first crystalline III-N material over a substrate, disposing a second layer other than a III-N material over the first layer and a third layer comprising a second crystalline III-N material over the second layer, such that the first crystalline III-N material has a first crystal orientation and the second crystalline III-N material has a second crystal orientation inverted with respect to the first crystal orientation, and forming a source, a drain, and a gate coupled to the third layer.

In one or more twenty-fourth embodiments, for any of the twenty-third embodiments, the second crystalline III-N material comprises a group III-face adjacent to the second layer and a nitrogen (N)-face opposite the second layer and the first crystalline III-N material comprises a group III-face adjacent to the second layer and a nitrogen (N)-face opposite the second layer.

In one or more twenty-fifth embodiments, for any of the twenty-third or twenty-fourth embodiments, forming the first layer, disposing the second layer, and disposing the third layer each comprises an epitaxial growth of the first layer, the second layer, and the third layer, respectively.

In one or more twenty-sixth embodiments, for any of the twenty-third through twenty-fifth embodiments, disposing the third layer over the second layer comprises forming the third layer by epitaxial growth on a second substrate, contacting the third layer with the second layer, and removing the second substrate.

In one or more twenty-seventh embodiments, for any of the twenty-third through twenty-sixth embodiments, the second layer comprises an amorphous material having a thickness of not more than 5 nm.

In one or more twenty-eighth embodiments, for any of the twenty-third through twenty-seventh embodiments, the method further comprises forming a fourth layer on the second layer, such that the fourth layer comprises a third crystalline III-N material having a different composition than the second crystalline III-N material, and the third crystalline III-N material has a third crystal orientation that is inverted with respect to the first crystal orientation, such that disposing the third layer over the second layer comprises an epitaxial growth of the third layer from the third crystalline III-N material.

In one or more twenty-ninth embodiments, for any of the twenty-third through twenty-eighth embodiments, the third crystalline III-N material comprises gallium nitride having a gallium-face adjacent to the second layer and a nitrogen-face opposite the second layer, the first crystalline III-N material comprises gallium nitride having a gallium-face adjacent to the second layer and a nitrogen-face opposite the second layer, the second layer comprises a third crystalline material comprising oxygen and aluminum, and the source and the drain comprise n-doped indium gallium nitride.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure comprising:
   a first layer comprising a first crystalline III-N material;
   a second layer comprising a second crystalline III-N material;
   an intervening layer other than a III-N material between the first layer and the second layer, wherein the first crystalline III-N material has a first crystal orientation and the second crystalline III-N material has a second crystal orientation inverted with respect to the first crystal orientation; and
   a source, a drain, and a gate coupled to the first layer.

2. The transistor structure of claim 1, wherein the first and second crystalline III-N materials comprise gallium nitride.

3. The transistor structure of claim 1, wherein the first crystal orientation comprises a first c-axis out of plane with respect to the first layer, the second crystal orientation comprises a second c-axis out of plane with respect to the second layer, and the first c-axis and the second c-axis are substantially aligned.

4. The transistor structure of claim 1, wherein the first crystalline III-N material comprises a group III-face adjacent to the intervening layer and a nitrogen (N)-face opposite the intervening layer and the second crystalline III-N material comprises a group III-face adjacent to the intervening layer and a nitrogen (N)-face opposite the intervening layer.

5. The transistor structure of claim 1, wherein the first crystalline III-N material comprises a nitrogen (N)-face adjacent to the intervening layer and a group III-face opposite the intervening layer and the second crystalline III-N material comprises a nitrogen (N)-face adjacent to the intervening layer and a group III-face opposite the intervening layer.

6. The transistor structure of claim 1, wherein the intervening layer comprises a third crystalline material having a thickness of not more than 5 nm.

7. The transistor structure of claim 6, wherein the third crystalline material comprises oxygen and one or both of aluminum and scandium.

8. The transistor structure of claim 1, further comprising:
   a third layer on the intervening layer, wherein the third layer comprises a third crystalline III-N material having a different composition than the first crystalline III-N material and the third crystalline III-N material has a third crystal orientation that is inverted with respect to the second crystal orientation, wherein the first layer is on the third layer.

9. The transistor structure of claim 1, wherein the intervening layer comprises an amorphous material having a thickness of not more than 5 nm.

10. The transistor structure of claim 9, wherein the amorphous material comprises at least one of aluminum oxide, silicon oxide, silicon nitride, or silicon oxynitride.

11. The transistor structure of claim 1, wherein the first crystalline III-N material comprises gallium nitride having a gallium-face adjacent to the intervening layer and a nitrogen-face opposite the intervening layer, the second crystalline III-N material comprises gallium nitride having a gallium-face adjacent to the intervening layer and a nitrogen-face opposite the intervening layer, the intervening layer comprises a third crystalline material comprising oxygen and aluminum, and the source and the drain comprise n-doped indium gallium nitride.

12. A system comprising:
   a memory; and
   an integrated circuit coupled to the memory, the integrated circuit including a transistor structure comprising:
      a first layer comprising a first crystalline III-N material;
      a second layer comprising a second crystalline III-N material;
      an intervening layer other than a III-N material between the first layer and the second layer, wherein the first crystalline III-N material has a first crystal orientation and the second crystalline III-N material has a second crystal orientation inverted with respect to the first crystal orientation; and
      a source, a drain, and a gate coupled to the first layer.

13. The system of claim 12, wherein the transistor structure comprises a PMOS transistor structure and the integrated circuit further comprises:
   a substrate, wherein the first layer is on the substrate; and
   an NMOS transistor structure comprising:
      a third layer on the substrate, the third layer comprising a third crystalline III-N material;
      a polarization layer on the third layer; and
      a second source, a second drain, and a second gate coupled to the third layer.

14. The system of claim 12, wherein the first crystalline III-N material comprises a group III-face adjacent to the intervening layer and a nitrogen (N)-face opposite the intervening layer and the second crystalline III-N material comprises a group III-face adjacent to the intervening layer and a nitrogen (N)-face opposite the intervening layer.

15. The system of claim 13, wherein the third crystalline III-N material comprises a group III-face adjacent to the polarization layer and a nitrogen (N)-face opposite the polarization layer.

16. The system of claim 13, wherein the first, second, and third crystalline III-N materials comprise gallium nitride and the source, the drain, the second source, and the second drain comprise n-doped indium gallium nitride.

17. The system of claim 12, wherein the intervening layer comprises a fourth crystalline material having a thickness of not more than 5 nm, the fourth crystalline material comprising oxygen and aluminum.

18. The system of claim 12, wherein the integrated circuit comprises one of a power management integrated circuit (PMIC) or a radio frequency integrated circuit (RFIC).

19. A method for fabricating a transistor structure comprising:
   forming a first layer comprising a first crystalline III-N material over a substrate;
   disposing a second layer other than a III-N material over the first layer and a third layer comprising a second crystalline III-N material over the second layer, wherein the first crystalline III-N material has a first crystal orientation and the second crystalline III-N material has a second crystal orientation inverted with respect to the first crystal orientation; and
   forming a source, a drain, and a gate coupled to the third layer.

20. The method of claim 19, wherein the second crystalline III-N material comprises a group III-face adjacent to the second layer and a nitrogen (N)-face opposite the second layer and the first crystalline III-N material comprises a group III-face adjacent to the second layer and a nitrogen (N)-face opposite the second layer.

* * * * *